United States Patent
Takagi et al.

(10) Patent No.: US 9,390,490 B2
(45) Date of Patent: Jul. 12, 2016

(54) METHOD AND DEVICE FOR TESTING DEFECT USING SEM

(75) Inventors: Yuji Takagi, Kamakura (JP); Minoru Harada, Fujisawa (JP); Ryo Nakagaki, Kawasaki (JP); Naoki Hosoya, Tokyo (JP); Toshifumi Honda, Yokohama (JP); Takehiro Hirai, Ushiku (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 1042 days.

(21) Appl. No.: 13/520,210

(22) PCT Filed: Dec. 22, 2010

(86) PCT No.: PCT/JP2010/007409
§ 371 (c)(1),
(2), (4) Date: Nov. 27, 2012

(87) PCT Pub. No.: WO2011/083540
PCT Pub. Date: Jul. 14, 2011

(65) Prior Publication Data
US 2013/0070078 A1 Mar. 21, 2013

(30) Foreign Application Priority Data

Jan. 5, 2010 (JP) .................................. 2010-000629
Mar. 15, 2010 (JP) ................................. 2010-056912

(51) Int. Cl.
*H04N 7/18* (2006.01)
*G06T 7/00* (2006.01)
*H01L 21/66* (2006.01)

(52) U.S. Cl.
CPC ....... *G06T 7/001* (2013.01); *G06T 2207/10061* (2013.01); *G06T 2207/20081* (2013.01); *G06T 2207/30148* (2013.01); *H01L 22/12* (2013.01); *H01L 2924/0002* (2013.01)

(58) Field of Classification Search
CPC ........... H01J 37/28; G06T 2207/30148; G06T 2207/10056; G06T 2207/10061; G06T 2207/30141; G06T 7/001; G01N 21/95607; G01N 21/9501; G01N 21/88

USPC .......................................................... 348/80
See application file for complete search history.

(56) References Cited

U.S. PATENT DOCUMENTS 5,991,699 A * 11/1999 Kulkarni ................. H01L 22/20
257/E21.525
6,047,083 A * 4/2000 Mizuno .............. G01N 23/2251
257/E21.525

(Continued)

FOREIGN PATENT DOCUMENTS

JP 2001-331784 11/2001
JP 2002-74335 3/2002

(Continued)

OTHER PUBLICATIONS

Office Action in corresponding foreign Japanese Application No. 2010-000629, mailed Mar. 4, 2014.

(Continued)

*Primary Examiner* — Michael Lee
(74) *Attorney, Agent, or Firm* — Baker Botts L.L.P.

(57) ABSTRACT

In performing a programmed-point inspection of a circuit pattern using a review SEM, stable inspection can be performed while suppressing the generation of a false report even when a variation in a circuit pattern to be inspected is large. SEM images that are obtained by sequentially imaging a predetermined circuit pattern using the review SEM are stored into a storage unit. Images that meet a set condition are selected from the stored SEM images, and averaged to create an average image (GP image). By performing pattern check by GP comparison using this GP image, an inspection can be performed while suppressing the generation of a false report even when a variation in the circuit patterns is large.

5 Claims, 29 Drawing Sheets

(56) References Cited

U.S. PATENT DOCUMENTS

| | | | |
|---|---|---|---|
| 6,284,553 B1* | 9/2001 | Steffan | H01L 22/20 257/E21.525 |
| 6,456,899 B1* | 9/2002 | Gleason | G03F 7/7065 700/110 |
| 6,898,305 B2* | 5/2005 | Hiroi | G01N 21/95684 356/394 |
| 7,424,146 B2* | 9/2008 | Honda | G06T 7/0004 348/125 |
| 7,570,797 B1* | 8/2009 | Wang | G01N 21/9501 250/559.45 |
| 7,734,082 B2* | 6/2010 | Honda | G06T 7/0004 348/126 |
| 2001/0028734 A1* | 10/2001 | Guest | G03F 7/7065 382/149 |
| 2001/0033683 A1* | 10/2001 | Tanaka | G06T 7/001 382/149 |
| 2001/0042705 A1 | 11/2001 | Nakagaki et al. | |
| 2002/0051565 A1* | 5/2002 | Hiroi | G01N 21/95607 382/149 |
| 2003/0015659 A1* | 1/2003 | Honda | G01N 23/225 250/306 |
| 2003/0076989 A1* | 4/2003 | Maayah | G06T 7/0004 382/145 |
| 2003/0203520 A1* | 10/2003 | Worster | G01N 21/94 438/14 |
| 2003/0228045 A1* | 12/2003 | Asai | G06K 9/4647 382/141 |
| 2006/0291714 A1* | 12/2006 | Wu | G01N 21/95607 382/149 |
| 2007/0031026 A1 | 2/2007 | Kurihara et al. | |
| 2007/0288219 A1* | 12/2007 | Zafar | G03F 1/84 703/14 |
| 2008/0002876 A1* | 1/2008 | Hiroi | G06T 7/001 382/144 |
| 2008/0292176 A1 | 11/2008 | Sakai et al. | |
| 2009/0032710 A1 | 2/2009 | Ozawa | |
| 2009/0161943 A1* | 6/2009 | Yamashita | G01N 21/9501 382/149 |
| 2009/0226075 A1 | 9/2009 | Hiroi et al. | |
| 2009/0252403 A1 | 10/2009 | Harada et al. | |

FOREIGN PATENT DOCUMENTS

| | | |
|---|---|---|
| JP | 2007-40910 | 2/2007 |
| JP | 2008-286586 | 11/2008 |
| JP | 2009-37939 | 2/2009 |
| JP | 2009-204410 | 9/2009 |
| JP | 2009-218241 | 9/2009 |
| JP | 2009-250645 | 10/2009 |

OTHER PUBLICATIONS

V. Svidenko, et al. Powerful Quantitative Monitoring Tool Improves Cu and W Plug Fill, Nanochip Technology Journal, Issue Two 2004, pp. 5-11.

* cited by examiner

METHOD AND DEVICE FOR TESTING DEFECT USING SEM

TECHNICAL FIELD

The present invention relates to techniques for inspecting semiconductor wafers, and in particular relates to a method and device for inspecting a defect using a scanning electron microscope (SEM), the method and device being suitable for inspecting a defect of a pattern formed on a semiconductor wafer by means of the SEM.

Moreover, the present invention relates to the comparison check at a predetermined position in visual check of a semiconductor wafer, and in particular relates to a method for generating a golden pattern image, the method being effective when the golden pattern image used for comparison check is difficult to be obtained from a specific place.

BACKGROUND ART

As a reduction in the feature size of circuit patterns formed in a semiconductor wafer progresses, the effect on the product yield, which defects generated in manufacturing processes have, increases. It is therefore increasingly important to manage the manufacturing processes so that such a defect is not generated in the manufacturing stage. Today, at the manufacture sites of semiconductor wafers, yield improvement measures are usually taken using a defect check device and a defect inspection device. The defect check device is a device that images the state of a wafer surface using an optical unit or an electron beam and automatically processing the resulting image, thereby quickly investigates which position on a wafer a defect is present at. In such a defect check device, the quickness is important, and therefore the amount of image data is reduced by increasing the pixel size (i.e., by a reduction in resolution) of an image obtained, as much as possible. In many cases, from a detected image of a low resolution, the presence of a defect might be confirmed but the type of the defect cannot be determined in detail.

On the other hand, the defect inspection device (review device) is a device that is used to obtain and inspect an image with the pixel size reduced (i.e., with a high resolution) for each defect detected by a defect check device. Such a defect inspection device is already brought to the market by a plurality of manufacturers, today. Some devices have a function to automatically classify captured images in order to help to identify the cause of a defect.

In the semiconductor manufacturing process in which a reduction in feature sizes increasingly progresses, the defect size may reach an order of tens of nanometers, and the resolution on the order of nanometers is required in order to inspect or classify defects. For this reason, in recent years, the defect inspection device using a scanning electron microscope is beginning to be widely used. Moreover, in the mass production line of semiconductor devices, streamlining of the inspection work (review work) of defects is desired, so a defect inspection device has started to have a function to automatically capture the image at a defect position detected by a defect check device (an ADR function: Automatic Defect Review function) or a function to classify the obtained images (an ADC function: Automatic Defect Classification function).

In semiconductor mass production lines, the occurrence of a defect in a manufacturing process needs to be properly monitored. Therefore, with regard to as many wafers as possible, the inspection by a defect check device and the inspection and classification of defects by a review SEM that is the defect inspection device need to be carried out, and thus in the defect check device and the review SEM, an improvement in the processing speed, i.e., the throughput, becomes particularly important. The throughput in the review SEM implies the number of defects that can be imaged and classified within a unit of time. The throughput of the review SEM brought to the market today is 1000-2000 [defects/time]. The throughput performance has been dramatically improving, and is more likely to be further increased in future, as well. A conventional art with regard to the function and the like of such a review SEM is disclosed in JP-A-2001-331784 (Patent Literature 1). Patent Literature 1 describes the configuration of a review SEM, the functions and operation sequences of ADR and ADC, and furthermore a method for displaying an obtained image or a classified result, and the like.

In order to detect a very fine defect in a visual check of semiconductors, a high resolution image captured by an electron beam microscope may be used. However, in inspection using the electron beam microscope, the detection of a very fine defect and the inspection at high speed cannot be combined, and therefore programmed-point inspection (fixed-point check) is performed, wherein inspection points within a chip are determined in advance and the check of the same inspection point of all the chips or selected chips within a wafer is performed. If this fixed-point check is performed by image comparison with a golden pattern image, highly sensitive inspection can be realized. By using the fixed-point check using an electron beam microscope in an early phase of semiconductor process development, external appearance information about a generated defect and information about a defect distribution within a wafer surface can be obtained, thus enabling to efficiently perform process conditioning.

As the literatures related to this, Patent Literature 2 discloses a comparison check method using a golden pattern image, as the programmed point inspection method using an electron beam microscope. Moreover, non-Patent Literature 1 discloses an example of characterizing a defect by using an inspection image, as the programmed point inspection method using an electron beam microscope.

CITATION LIST

Patent Literatures

Patent Literature 1: JP-A-2001-331784
Patent Literature 2: JP-A-2009-37939

Non Patent Literature

Non-Patent Literature 1: V. Svidenko, et al., "Powerful Quantitative Monitoring Tool Improves Cu and W Plug Fill", pp. 5-11, Issue Two 2004, Nanochip Technology Journal (2004)

SUMMARY OF INVENTION

Technical Problem

As a reduction in the feature size of circuit patterns progresses, a reduction in the size of a defect to be inspected or observed also proceeds. When the design rule of circuit patterns becomes equal to or less than several tens of nanometers, a proximity effect occurs between the light beams exposing adjacent patterns and thus a pattern with a desired shape cannot be exposed. As the countermeasure of this, exposure using a mask pattern having been subjected to optical proximity correction (OPC) is carried out. However, when a pattern is formed on a wafer using such a mask pattern, the shape of the pattern is vulnerable to a process variation and thus a defective shape of a pattern and/or a fine defect are likely to be caused.

In order to manufacture such a pattern at a good yield, it is necessary to inspect a specific pattern having been subjected to OPC correction (to perform programmed-point inspection), the specific pattern being sensitive to process variations, detect a defective shape and/or a fine defect, and monitor the process stability. When attempting to inspect or observe such a pattern with a conventional optical inspection device, the resolution is not sufficient and the check of a fine defect is becoming difficult in a low-resolution defect check device.

On the other hand, as a unit capable of capturing a high-resolution image, a critical dimension SEM (CD-SEM), a review SEM, and the like using a scanning electron microscope (SEM) are already put into practical use. The critical dimension SEM is a device used for applications to measure the dimensions of a pattern and/or the spacing between patterns from an obtained SEM image, and is thus not suitable for inspection of the shape of a pattern and/or the detection of a defect thereof. On the other hand, the review SEM is a device that obtains the SEM images of a defect using the positional information about the defect detected by other inspection device and inspects and classifies the defect, and is suitable for inspection of the shape of a fine pattern of interest in the present invention and/or the detection of a defect thereof.

Conventionally, when a defect is inspected using the review SEM device, for each defect to be inspected, a SEM image obtained by imaging a region including a defect to be inspected is compared with a SEM image obtained by imaging a region that does not include a defect, a portion having a difference is extracted as a defect, and the image of this portion is inspected. However, with an increase in integration of semiconductor devices, the number of portions sensitive to process variations is significantly increasing, and therefore the conventional method using a review SEM leads to an increase in the number of SEM images to obtain and an increase in the amount of image data to process, and also a significant increase in the image processing time. This necessitates such a throughput lowering of pattern inspection and defect inspection that the conventional method cannot be used.

The present invention is aimed to provide a method for inspecting and observing defects, the method enabling to perform the inspection of a fine pattern and the check of a defect without reducing the throughput, and a device therefor.

With a reduction in feature sizes of semiconductors and an increase in complexity of processes, the process margin decreases and the process conditioning is becoming difficult. For this reason, in an early phase of semiconductor development, there may be no good chip across the surface of a wafer, posing a problem that a golden pattern image for comparison check cannot be captured.

Patent Literature 2 discloses a comparison check method using a golden pattern image stored in advance, as a programmed point inspection method using an electron beam microscope, but does not describe the above-described problem and therefore does not disclose a method for obtaining a golden pattern image. For this reason, with the method described in Patent Literature 2, when there is no good chip across the surface of a wafer, a golden pattern image cannot be obtained and the comparison check cannot be implemented.

Moreover, Non-Patent Literature 1 discloses, as a programmed point inspection method using an electron beam microscope, a method for characterizing a captured defect image by image processing. However, it does not disclose a comparison check using a golden pattern image. For this reason, with the method described in Non-Patent Literature 1, a highly sensitive inspection capable of extracting a fine defect cannot be implemented.

The present invention has been made in view of the above circumstances and provides a method for generating a golden pattern image in comparison check and a method for evaluating a generated golden pattern image, thereby enabling to accommodate the comparison check in an object to be inspected in which there is no good product, and providing a visual inspection method and a visual inspection device realizing highly sensitive inspection.

Solution to Problem

As the check of a circuit pattern formed on a semiconductor wafer, usually the wafer is imaged with a scanning electron microscope (SEM) and the obtained image is processed to detect a defect of the circuit pattern. For imaging in the SEM, a semiconductor wafer is scanned by deflecting an electron beam, and the secondary electron and back-scattered electron generated from a wafer are captured by a detector to image the wafer. On a wafer, a plurality of dies are repeatedly arranged in a grid form, and the same circuit pattern is formed in each die. Therefore, in order to perform inspection, one of the corresponding portions of each die is set to an inspection image and another one is set to a golden pattern image and these images are compared to each other to detect a defect. Moreover, in a memory mat portion in a die, a plurality of memory cells are repeatedly arranged in a grid form, and the same circuit pattern is formed in each memory cell. Therefore, the comparison check is similarly performed between memory the cells.

In order to achieve the above-described objectives, in an inspection method and an inspection device of the present invention, fixed-point check or ROI inspection is performed, wherein a plurality of SEM images obtained by sequentially imaging predetermined regions of interest (ROI) in each die by a SEM are stored into a storage unit, and a reference image is created from these stored SEM images, and this reference image is sequentially compared with the stored SEM images to detect a defect.

That is, in order to achieve the above-described objectives, in the present invention, a defect check device using a SEM comprises: a scanning electron microscope unit with a table that mounts a sample thereon and is movable within a plane, the sample having a plurality of dies formed therein, the dies each having a pattern of a same shape; a storage unit configured to store a SEM image of the sample that is obtained by imaging the sample mounted on the table by means of the scanning electron microscope unit; an image processing unit configured to process the SEM image of the sample stored in the storage unit and detect a defect on the sample; an input/output unit configured to input a condition for the image processing unit to process the SEM image of the sample and output a result of the processing; and a control unit configured to control the scanning electron microscope unit, the storage unit, the image processing unit, and the input/output unit, wherein the control unit controls the scanning electron microscope unit to sequentially image a predetermined region of each of a plurality of dies formed on the sample, sequentially obtain the SEM image of the predetermined region of each of the plurality of dies, and store the sequentially obtained SEM images of the predetermined region into the storage unit, and wherein the image processing unit creates a reference image using the sequentially obtained SEM images of the predetermined region stored in the storage unit, compares the created reference image with the sequentially obtained SEM images of the predetermined region stored in the storage unit to extract a defect, and classifies the extracted defect.

Moreover, in order to achieve the above-described objectives, in the present invention, in a defect inspection method using a SEM: a predetermined region of each of a plurality of dies formed on the sample, each die having a pattern of a same shape, is sequentially imaged using a scanning electron microscope unit to sequentially obtain the SEM image of the predetermined region of each of the plurality of dies; the sequentially obtained SEM images of the predetermined region are stored into a storage unit; a reference image is created using the sequentially obtained SEM images of the predetermined region stored in the storage unit; and the created reference image is compared with the sequentially obtained SEM images of the predetermined region stored in the storage unit to extract a defect, and the extracted defect is classified.

Furthermore, in order to achieve the above-described objectives, in the present invention, in a defect inspection method using a SEM: a predetermined region of each of a plurality of dies formed on the sample, each die having a pattern of a same shape, is sequentially imaged using a scanning electron microscope unit to sequentially obtain the SEM image of the predetermined region of each of the plurality of dies; the sequentially obtained plurality of SEM images of the predetermined region are stored into a storage unit; the plurality of SEM images stored in the storage unit are processed to create a histogram of feature quantities of the plurality of SEM images, and this histogram is displayed on a screen; a range of feature quantities of the SEM images is set on the screen in which the histogram of feature quantities of the SEM images is being displayed; a SEM image having a feature quantity within the set range is selected among the plurality of SEM images stored in the storage unit; a reference image is created using the selected SEM image; and the created reference image is compared with the sequentially obtained SEM images of the predetermined region stored in the storage unit to extract a defect, and the extracted defect is classified.

Furthermore, according to an aspect of the present invention, a visual inspection method for inspecting an appearance of a semiconductor wafer having a plurality of chips formed therein, comprises the steps of: imaging an inspection point of a corresponding pattern that is formed so as to be identical to each of the plurality of chips; generating an average image using the captured image; comparing the average image with information representing a pattern layout design corresponding to the captured image and selecting, as a golden pattern image, a captured image satisfying a predetermined condition; and inspecting by comparing the golden pattern image with the captured image.

Moreover, according to an aspect of the present invention, a semiconductor wafer inspection method comprises the steps of imaging an identical chip-coordinate position of a plurality of chips fabricated on a wafer; comparing the captured image with a golden pattern image; and evaluating the golden pattern image generated from the captured image using information about a pattern layout design corresponding to the captured image.

Moreover, according to an aspect of the present invention, an inspection method comprises the steps of: imaging different positions of a plurality of chips fabricated on a semiconductor wafer; comparing the captured image with a golden pattern image; and evaluating this golden pattern image generated from this captured image using information about a pattern layout design corresponding to this captured image for the each different position.

Moreover, according to an aspect of the present invention, an inspection method comprises the steps of: imaging different positions of a plurality of chips fabricated on a semiconductor wafer; comparing the captured image with a golden pattern image; and evaluating this golden pattern image generated from this captured image using information about a pattern layout design corresponding to this captured image for each position having the same circuit pattern.

Moreover, according to an aspect of the present invention, a visual inspection device comprises: a unit configured to image an inspection point of a corresponding pattern that is formed so as to be identical to each of a plurality of chips formed on a semiconductor wafer; a unit configured to compare the captured image with a golden pattern image; an input unit configured to receive information representing a pattern layout design corresponding to the captured image; and a data conversion unit configured to convert data so that the information representing the pattern layout design is compared with the captured image, wherein the visual inspection device further comprises: a unit configured to generate an average image using the captured image; and a unit configured to compare the average image with information representing a pattern layout design corresponding to the captured image and select, as the golden pattern image, a captured image satisfying a predetermined condition.

Advantageous Effects of Invention

According to the present invention, the inspection of a fine pattern and the check of a defect by programmed-point inspection on a wafer can be performed without reducing the throughput.

Moreover, according to the present invention, even in a state where a good chip cannot be obtained in an early phase of semiconductor development, a golden pattern image for executing a comparison check can be generated. Thus, the occurrence of a defect can be grasped by implementing a highly sensitive comparison check, and the process conditioning can be speeded up.

DESCRIPTION OF EMBODIMENTS

Hereinafter, the embodiments of the present invention will be described with reference to the accompanying drawings.

Embodiment 1

Figure 1:
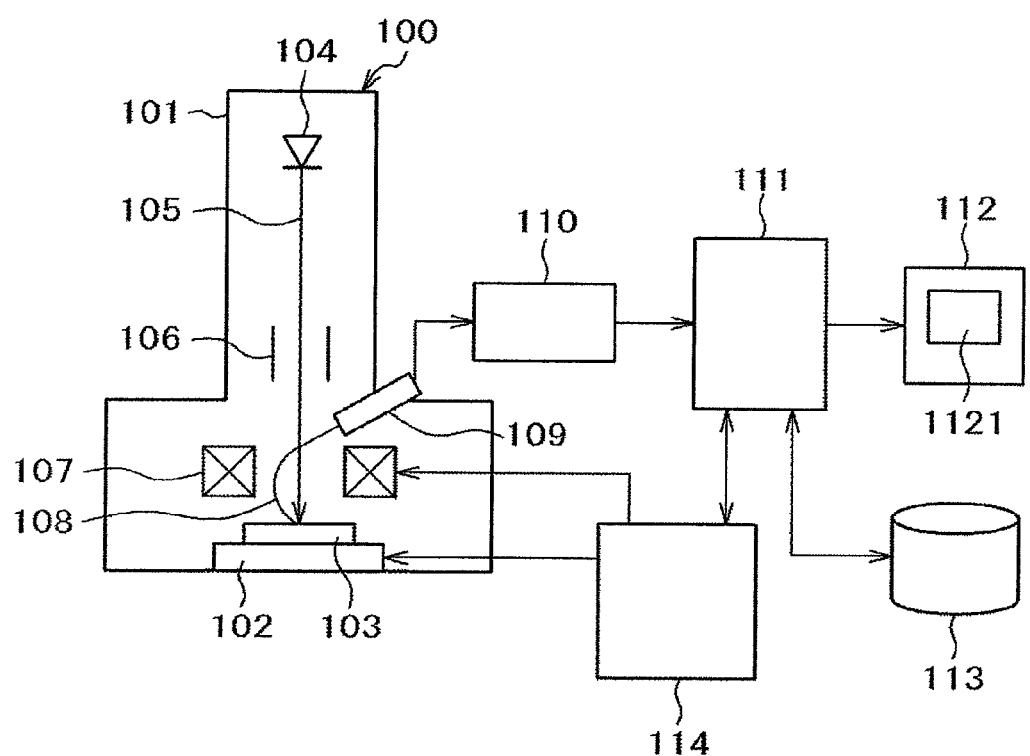
FIG. 1 is a view showing an example of a defect inspection device in an embodiment of the present invention.

A first embodiment is described below, wherein the present invention is applied to a defect inspection device (hereinafter, referred to as a review SEM) using a SEM. FIG. 1 shows an example of the configuration of the defect inspection device (defect review SEM device) using a SEM in the embodiment. The defect inspection device comprises an electron beam microscope 100, an A/D converter 110, a processing unit 111, a user interface unit 112, a storage unit 113, and a general control unit 114.

The electron beam microscope 100 includes: a table 102 movable within a plane inside an enclosure 101; an electron-gun 104 emitting an electron beam 105; a deflector 106 deflecting the electron beam 105 emitted from the electron-gun 104; an electron lens 107 adjusting the focusing position of the electron beam 105; and a detector 109 that detects a secondary electron 108 generated from a semiconductor wafer 103 scanned by and irradiated with the electron beam 105 whose focusing position is adjusted by the electron lens 107, in synchronization with a deflection signal made by the deflector 106. The secondary electron detected by the detector 109 is converted to an electric signal, and is then further converted to a digital image signal by the A/D converter 110, and is input to the processing unit 111 and subjected to image processing.

In the defect inspection device with the above-described configuration, based on the positional information about an inspection region on the semiconductor wafer 103 that is stored in advance in the storage unit 113, the general control unit 114 drives the table 102 so that the inspection region on the semiconductor wafer 103 is within the inspection field of view of the detector 109 of the electron beam microscope 100. Next, the general control unit 114 controls the electron beam microscope 100 to obtain an alignment pattern image within this inspection field of view, and compares the same with an alignment pattern registration image, which is registered in advance, to calculate the position of the inspection region. Next, the calculated position of the inspection region is imaged with the electron beam microscope 100 to obtain an inspection region image, and this inspection region image is compared with a GP, which is registered in advance, to extract a defect. Finally, the feature quantity on the image of this extracted defect is extracted, and the defect is classified based on a predetermined rule. The image of the extracted defect and the result of classification of the defect are displayed on a screen 1121 of the user interface unit 112.

Figure 2:
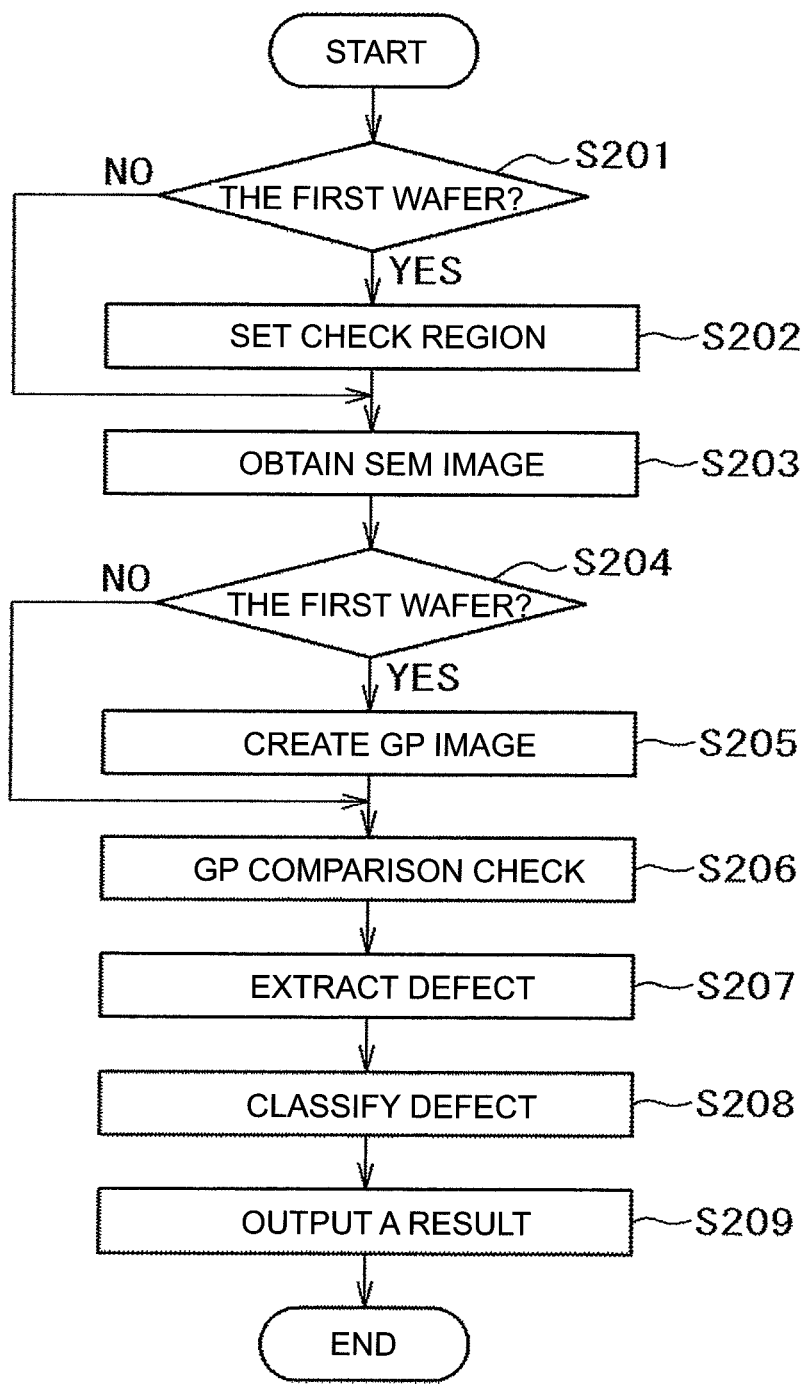
FIG. 2 is a flow diagram showing a procedure of a method for performing a fixed-point check in Embodiment 1.

An example of the procedure of a method for performing a fixed-point check or an ROI (Region Of Interest) inspection is shown in FIG. 2, wherein in each die formed on a semiconductor wafer, a predetermined region (or pattern) of interest is set to an inspection image using the above-described device and is compared with a reference image (GP (Golden Pattern) image) to detect a defect.

First, whether a wafer is the first wafer is determined (S201), and if the answer is "YES", then a region including a DOI (Defect of Interest) or an ROI (Region of Interest) is specified among patterns of dies of a wafer to be inspected, from the user interface unit 112 (S202). Next, for each die of the wafer to be inspected, a region including a pattern of the same shape as the shape of the specified DOI or the same region as the ROI is sequentially imaged using the SEM to obtain a plurality of SEM images, and the obtained SEM images are stored into the storage unit 113 together with the positional information (S203).

Next, again whether the wafer is the first wafer is determined (S204), and if the answer is "YES", then using the plurality of SEM images obtained and stored into the storage unit 113 in Step 203, an averaging process is performed in the processing unit 111 to create a GP image (S205). Next, in the processing unit 111, the GP image is sequentially compared with a plurality of images stored in the storage unit 113 and inspected to detect defect candidates (S206), and a defect is extracted from the detected defect candidates (S207).

Next, the extracted defect is classified for each type (S208), and the result is output (S209). A wafer, in which the acquisition of SEM images is completed in Step 203, is carried out from the review SEM while the processing of the steps from S203 to S209 are performing in the processing unit 111 and the storage unit 113, and the next wafer to be inspected is carried in. This carried-in wafer to be inspected is determined not to be the first wafer in Step 201, and the step of SEM image acquisition of S203 is promptly performed, and a SEM image is obtained using the information about the inspection region, which was set in S202 when the wafer was the first wafer, and is stored into the storage unit 113.

Furthermore, also in S204, the wafer is determined not to be the first wafer, and then the flow proceeds to the step of GP comparison check of S206, where the GP comparison check is performed using the GP image, which was created using the first wafer, and thereafter the steps from S207 to S209 are sequentially performed.

In the embodiment, the SEM image of a region including a DOI or a ROI specified in S201 can be sequentially obtained across the whole region of the wafer in the step of S202, and all the obtained SE images can be once stored into the storage unit 113, and a series of processes from S203 to S207 can be performed asynchronously with the acquisition of a SEM image using the stored images. Therefore, the review SEM, after obtaining an image in the region to be inspected on the wafer, can promptly replace the current wafer with the next wafer and repeat the same operation, and can perform the check of a region including a DOI or an ROI and the extraction of a defect without reducing the throughput.

In FIG. 2, a process flow has been described, in which the steps of S202 and S205 are skipped for the second and subsequent wafers. However, because the processes of S205 and thereafter are processed asynchronously with S203, the determination step of S204 may be eliminated, and also for the second and subsequent wafers, a GP image may be created for each wafer using the SEM image of each wafer in S205. Also in this case, the check of a region including a DOI or an ROI and the extraction of a defect can be performed without reducing the throughput.

In the SEM images sequentially obtained across the whole region of the wafer in the step of obtaining the SEM image of S202, image noise (hereinafter, simply referred to as noise) is generated by circuit noise generated in an electro-optic circuitry. The state of noise differs between an inspection image and a reference image, and therefore in comparison between the inspection image and the reference image, the difference in noise will be detected as a false report. In order to suppress the false report, the defect detection sensitivity is forced to be reduced and thus the overlooking of an actual defect may occur. In order to suppress a false report and prevent the overlooking of an actual defect, the noise generated in an image needs to be reduced. With a reduction in semiconductor process node geometry, the detection of finer defects is required and the necessity of a reduction in noise generated in an image tends to increase.

In the present invention, in order to reduce the noise generated in an image, an average image is created by using the images of a plurality of dies and calculating an average, and this average image is used as a reference image, thereby reducing the noise generated in the reference image.

Figure 3:
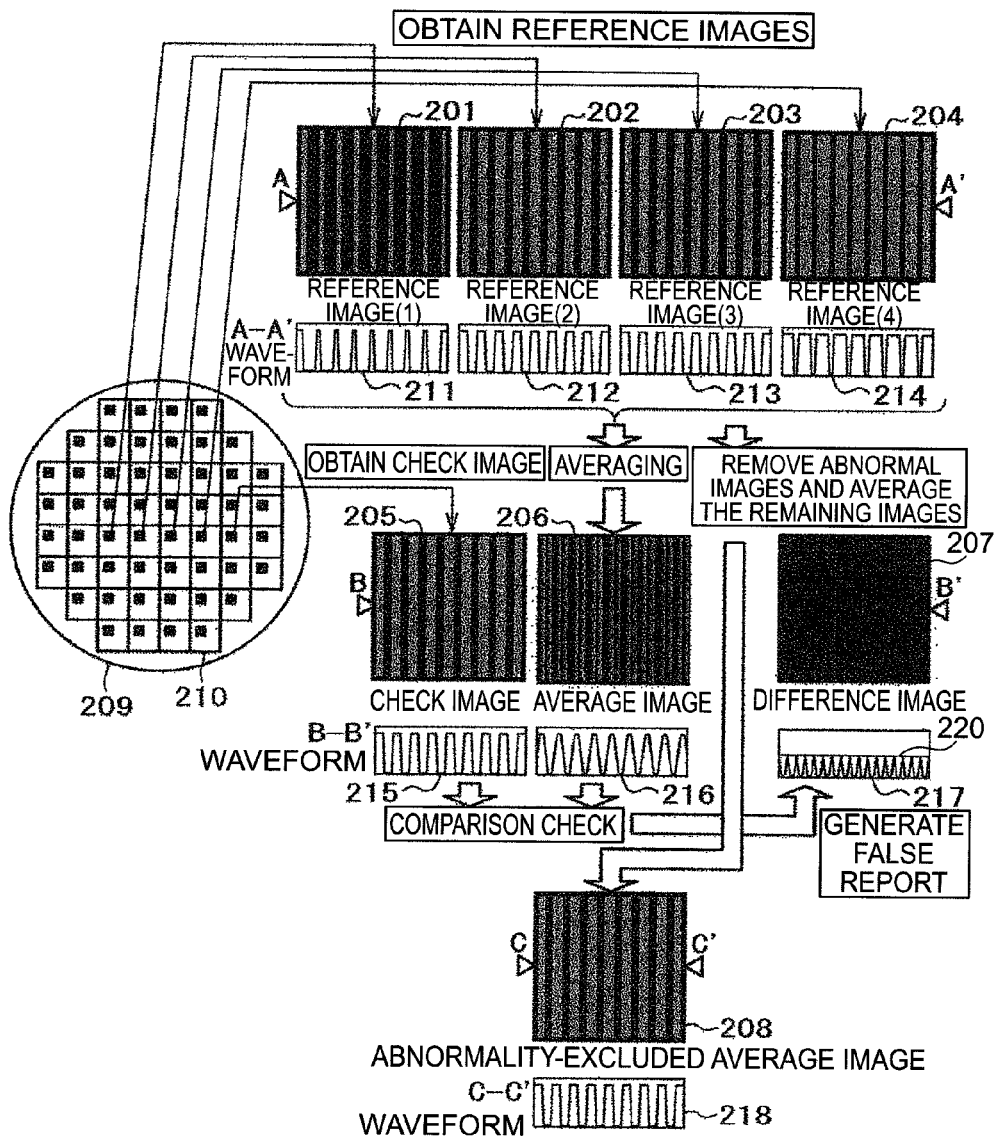
FIG. 3 is a view showing a procedure of detecting a defect using an average image in Embodiment 1.

The concept of the average image is shown in FIG. 3. On a wafer 209, a plurality of dies 210 are repeatedly arranged in a grid form, and there are a reference image (SEM image)(1) 201, a reference image (SEM image)(2) 202, a reference image (SEM image)(3) 203, and a reference image (SEM image)(4) 204 that are obtained by imaging a corresponding portion of each die with a SEM-type wafer inspection device. The line width of a circuit pattern of the reference image (1) 201 is narrow, and the line width of the reference image (2) 202 and the reference image (3) 203 is medium, and the line width of the reference image (4) 204 is wide. The corresponding brightness waveforms of an A-A' portion are a reference waveform (1) 211, a reference waveform (2) 212, a reference waveform (3) 213, and a reference waveform (4) 214, respectively.

The one obtained by calculating an average thereof is an average image 206 (while in FIG. 3, for ease of understanding, a case is described, where the average image 206 is created using four reference images (1) to (4), the average image 206 is actually created using the SEM images of all the dies on the wafer 209). Here, the averaging process is carried out by calculating the average value of the corresponding pixel value of each reference image and using the same as the average image 206. The brightness waveform of a B-B' portion is an average waveform 216. An inspection image 205 is obtained by imaging the corresponding portion of an inspection die, and the brightness waveform of the B-B' portion is an inspection waveform 215. The one obtained by comparison check between the inspection image 205 and the average image 206 is a difference image 207, and the brightness waveform of the B-B' portion is a difference waveform 217. The difference waveform 217 is compared with a threshold 220, and a difference waveform equal to or greater than the threshold is extracted as a defect.

In the above-described embodiment, a case is described, where the average image 206 is created using the SEM images of all the dies of the wafer 209, however usually between a peripheral portion and a center portion of a wafer, a slight difference may be generated in the shape of the pattern formed in each die. In such a case, average images that differ between the peripheral portion and the center portion of a wafer, respectively, may be created, that is, two types of average images: an average image used for check of the dies in the peripheral portion; and an average image used for check of the dies in the center portion, may be created by using only the patterns of dies in a peripheral portion of a wafer and only the patterns of dies near a central portion of the wafer, respectively. Furthermore, an intermediate portion may be provided between a center portion and a peripheral portion of a wafer, and an average image for each of these three regions may be created to perform the inspection.

Moreover, an average may be calculated from the reference images excluding the reference image (1) 201 and the reference image (4) 204 that are regarded as abnormal values. This results in an abnormality-excluded average image 208. The corresponding brightness waveform of a C-C' portion is an abnormality-excluded average waveform 218. In the average image 208 having removed abnormalities, the edge of a circuit pattern becomes sharp, and thus the average image can be prevented from deviating from an ideal image due the variation in the cross-sectional shape of the edge.

While in the above-described embodiment, an average image is created from a plurality of obtained SEM images and is used as the reference image, one image may be extracted from a plurality of obtained SEM images and this extracted image may be used as the reference image. For example, with regard to a plurality of obtained images, the sharpness (edge sharpness) of a pattern edge signal or a pattern width may be evaluated to select an image closest to an ideal pattern (a design pattern) and this selected image may be used as the reference image.

According to the embodiment, an average image can be relatively easily created from the stored SEM images, and therefore the GP comparison check can be relatively easily implemented without carrying out too complicated processing.

Embodiment 2

In Embodiment 1, an average image created using all the SEM images or an image excluding abnormal values is used as a GP image, however because a sharp state of the edge of a circuit pattern is ideal, the average image 206 may not necessarily serve as the ideal image. That is, in the case where the signal of an edge portion of a pattern in an average image created from all the SEM images is rounded, if the inspection image is the image of a normal pattern and the edge of this pattern is sharp, this normal pattern might be detected as a defect.

Moreover, in the case where an ideal image is biased in the variations in a circuit pattern, even if the reference image (4) 204 is an ideal image, the abnormality-removed average image 208 has a different line width and therefore the reference image (4) 204 again may not serve as an ideal image.

Then, in the embodiment, in order to reduce the noise generated in an image, using the history of the images of a plurality of dies, an average of each of these images is calculated for each pixel to create an ideal image, and this ideal image is used as a reference image, thereby reducing the noise generated in the reference image. Moreover, a reference image whose pixel value for each pixel is an outlier, a reference image whose pixel value is far away from the medium value, and the like are regarded as abnormal values, and an average excluding the abnormal values is calculated to create an ideal image.

While the whole process flow in the embodiment is the same as the process flow shown in FIG. 2 described in Embodiment 1, the content of the detailed processing of the step of generating a GP image of S203 differs.

Figure 4:
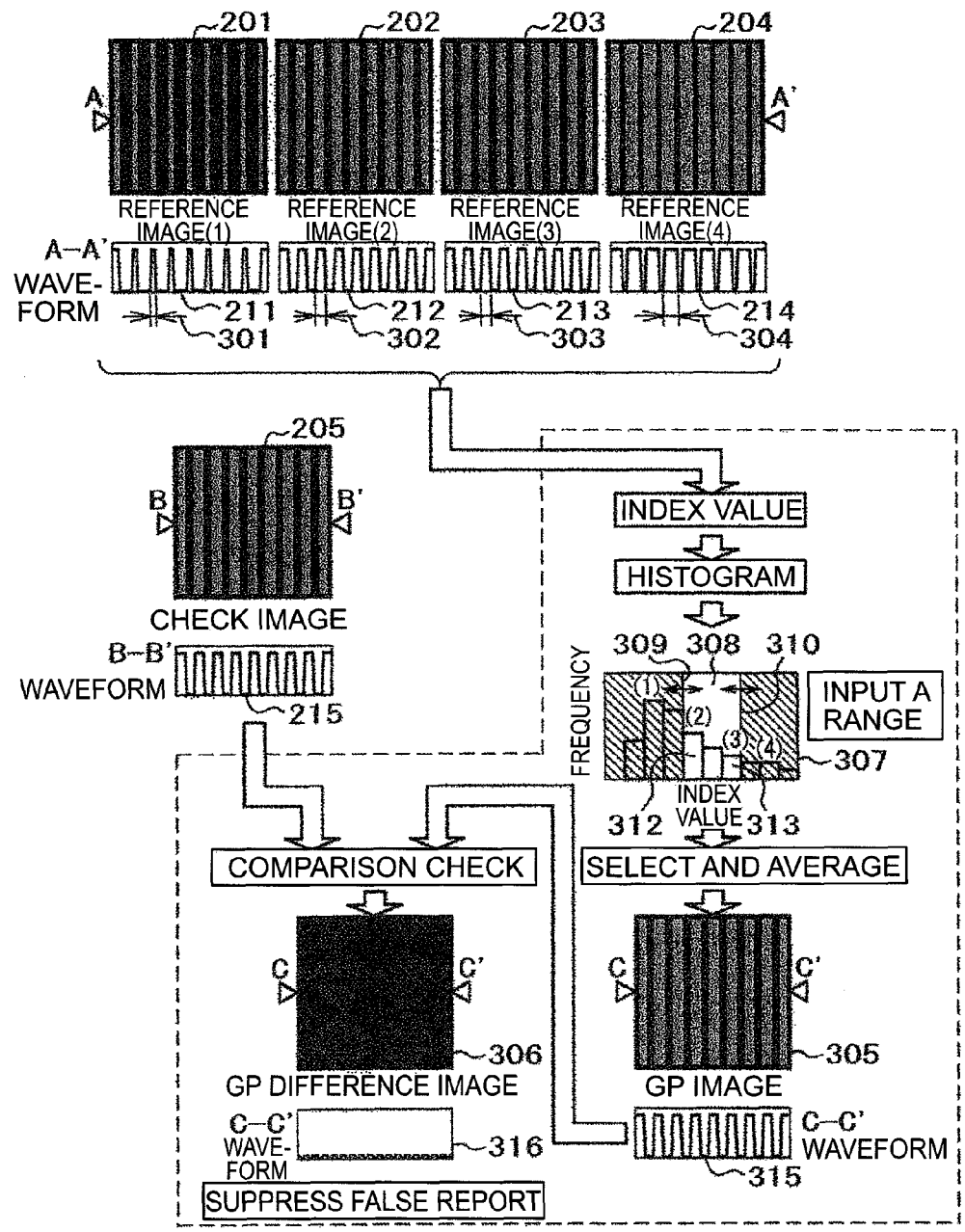
FIG. 4 is a view showing the procedure of a GP image generation method in Embodiment 2.

The concept of a GP image generation method according to the embodiment is shown in FIG. 4. The corresponding portions of a plurality of dies on a wafer are imaged with the review SEM shown in FIG. 1 to obtain a plurality of reference images, i.e., in FIG. 4, the reference image (1) 201, the reference image (2) 202, the reference image (3) 203, and the reference image (4) 204 as with Embodiment 1, and these obtained reference images are stored into the storage unit 113.

The images stored in the storage unit 113 are invoked to the processing unit 111, where an index value is calculated for each reference image. This index value may be an image feature quantity of the image of a circuit pattern included in each SEM image, e.g., the line width or the like of a circuit pattern. In FIG. 4, the line width corresponding to each reference image is a line width (1) 301, a line width (2) 302, a line width (3) 303, and a line width (4) 304, respectively. A histogram 307 is calculated from the calculated index values, and is displayed on the GUI screen 1121 of the user interface unit 112. While in the view, only four reference images, reference waveforms, and line widths are illustrated, respectively, reference images for more dies may be obtained. The histogram 307 of FIG. 4 represents a histogram of the index values calculated for more dies.

Next, a user inputs an appropriate range 308 on the histogram 307. The appropriate range 308 is a range of the index values corresponding to the reference images suitable for use to create a GP image. This shows a case where a range lower limit 309 is set so that an index value (2) 312 corresponding to a reference image, which a user determines to be close to an ideal state among a plurality of reference images, i.e., the reference image (2) 202 in the example of FIG. 4, is included in the appropriate range 308, and similarly a range upper limit 310 is set so that the index value (3) 313 corresponding to the reference image (3) 203 is included in the appropriate range 308.

Next, only the reference images corresponding to the input appropriate range 308, i.e., the reference image (2) 202 and the reference image (3) 203 in the view, are selected and averaged to create a GP image 305 and this GP image 305 is displayed on the GUI. The corresponding brightness waveform of a C-C' portion is a GP waveform 315. Because the GP image 305 is displayed on the GUI screen 1121 of the user interface unit 112, a user can confirm the validity of the GP image 305.

The one obtained by comparison check between the inspection image 205 and the created GP image 305 is a GP difference image 306, and the brightness waveform of the C-C' portion is a GP inspection waveform 316. The difference in brightness on the GP difference image 306 is reduced as compared with a difference image 206 of the conventional method, and a false report is suppressed. Moreover, this index value may be a summation of differences between the pixel value of each reference images and the pixel value of a normal image, for example.

Figure 5:
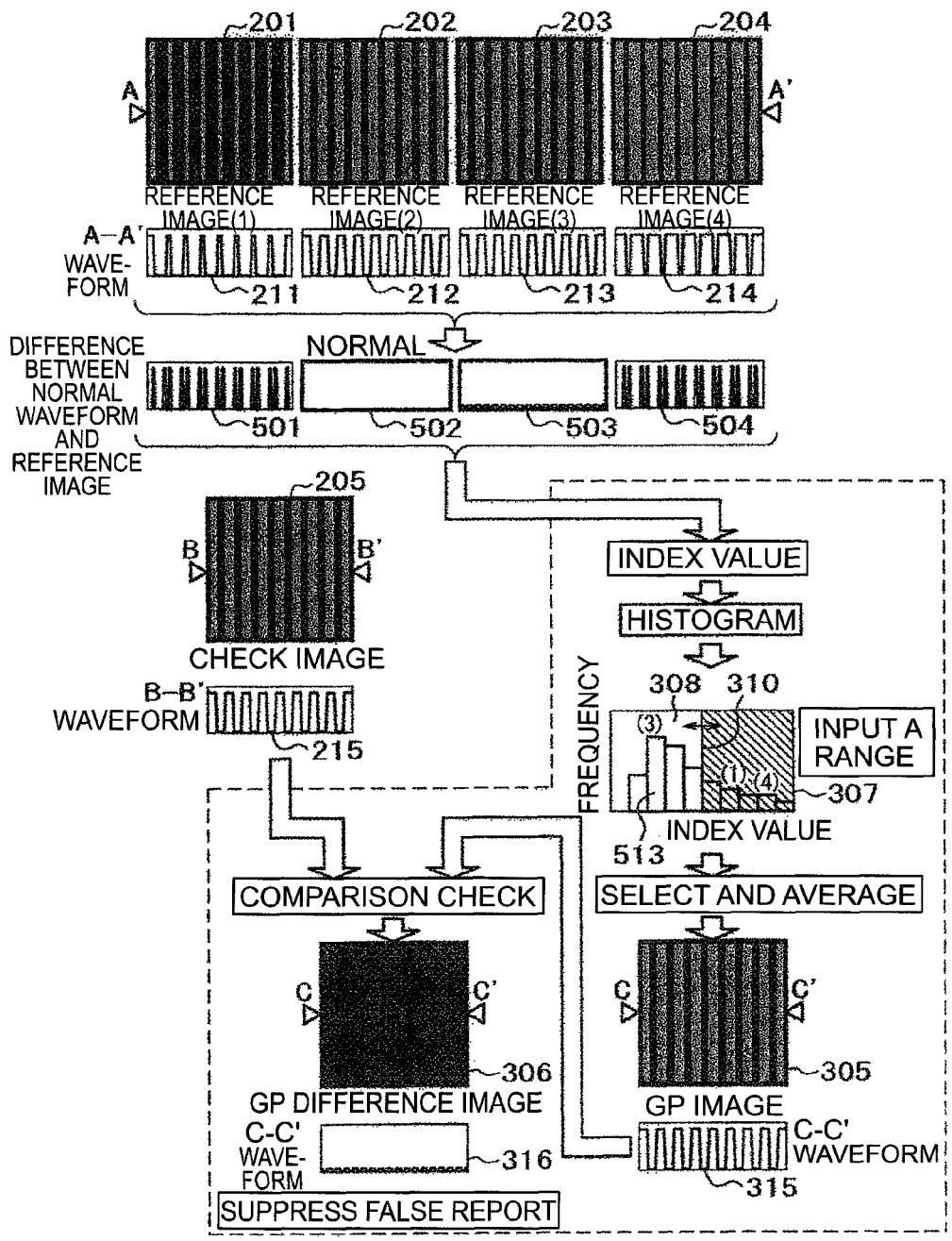
FIG. 5 is a view showing a procedure of the GP image generation method using a summation of differences as an index value in Embodiment 2.

The concept of a GP image generation method using a summation of differences as the index value is shown in FIG. 5. If the reference image (2) is a normal image, then the waveform of the difference between each reference image and the normal image is a difference waveform (1) 501, a difference waveform (2) 502, a difference waveform (3) 503, and a difference waveform (4) 504, respectively. As the index value of each reference image, a summation of the differences is calculated. From the calculated index value, a histogram 307 is calculated and displayed on a GUI.

Next, a user inputs an appropriate range 308 on the histogram 307. In FIG. 5, a user adjusts a range upper limit 310 so that the index value (3) 513 corresponding to the reference image (3) 203 is included in the appropriate range 308. Next, only the reference images corresponding to the input appropriate range 308 are selected and averaged to create the GP image 305, and the GP image 305 is displayed on the GUI. The one obtained by comparison check between the inspection image 205 and the created GP image 305 is the GP difference image 306, and the brightness waveform of a C-C portion is the GP inspection waveform 316.

Figure 6:
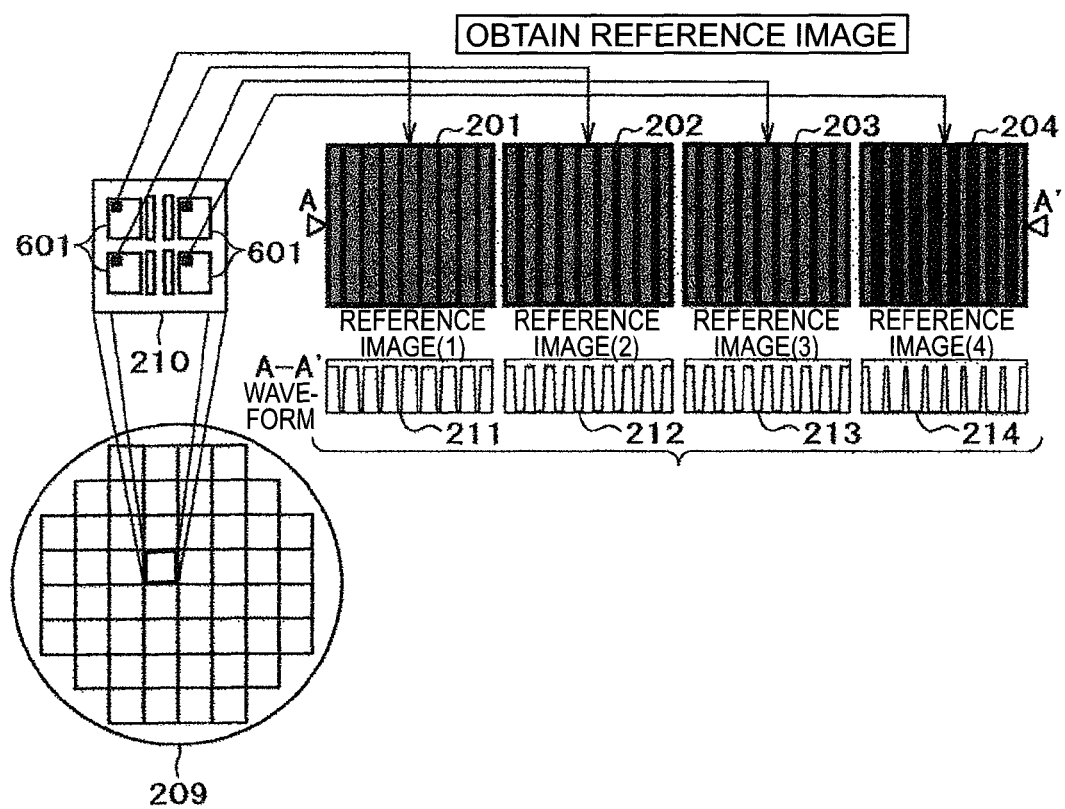
FIG. 6 is a view illustrating the concept of reference image acquisition position in Embodiment 2.

Moreover, a reference image may be obtained from a plurality of places within one die. An example of the concept of reference image acquisition position is shown in FIG. 6. A plurality of identical patterns 601 may be arranged in each die 210 on the wafer 209. In this case, the reference image (1) 201, the reference image (2) 202, the reference image (3) 203, and the reference image (4) 204 are obtained by imaging the corresponding portion of the identical pattern 601 with the review SEM. The corresponding brightness waveforms of the A-A' portion are the reference waveform (1) 211, the reference waveform (2) 212, the reference waveform (3) 213, and the reference waveform (4) 214, respectively. The position of the identical pattern may be calculated from design information, or a user may watch the obtained image and specify the position of the identical pattern, or the obtained image may be subjected to image processing to search the identical pattern.

Figure 7:
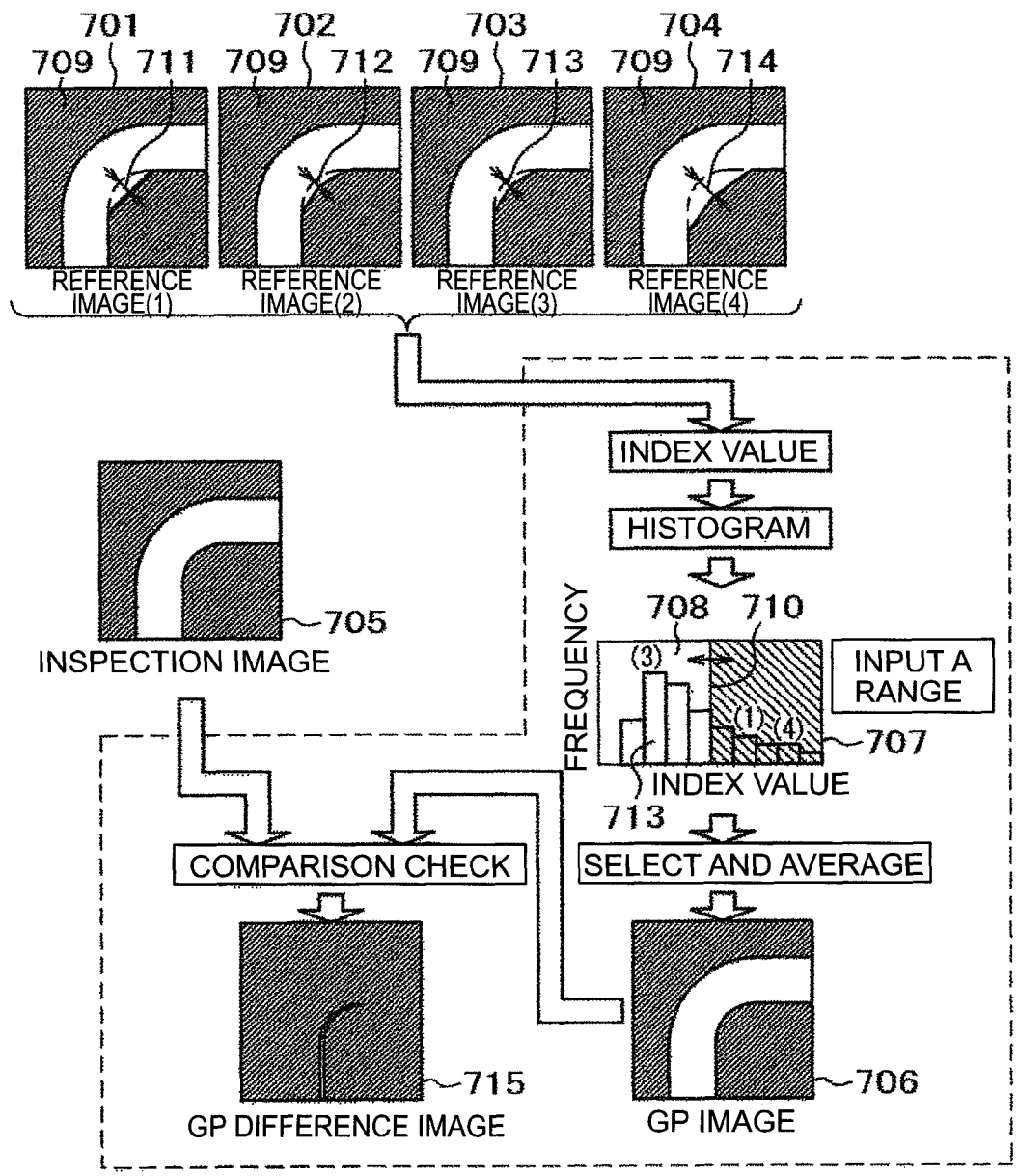
FIG. 7 is a view showing another example of the procedure of the GP image generation method in Embodiment 2.

As another example of the concept of the GP image generation method according to the embodiment, a case is shown in FIG. 7, where an FEM (Focus Exposure Matrix) wafer fabricated by varying the focal distance and the exposure in a lithography step of the semiconductor process is a target for this method. The corresponding portions of a plurality of dies on the FEM wafer are imaged with the review SEM to obtain a plurality of reference images, i.e., a reference image (1) 701, a reference image (2) 702, a reference image (3) 703, and a reference image (4) 704 in FIG. 7.

The index value is calculated for each reference image. This index value may be, for example, the amount of divergence or the like at a position where divergence between the shape of a circuit pattern of each reference image and a design shape 709 is large. In the view, the amount of divergence of each reference image is an amount of divergence (1) 711, an amount of divergence (2) 712, an amount of divergence (3) 713, and an amount of divergence (4) 714, respectively. A histogram 707 is calculated from the calculated index values, and is displayed on the GUI.

Next, a user inputs an appropriate range 708 on the histogram 707. In the view, for example, a user adjusts a range upper limit 710 on the GUI screen 1121 of the user interface unit 112 so that the amount of divergence (3) 713 corresponding to the reference image (3) 703 is included in the appropriate range 708. Next, only the reference images corresponding to the input appropriate range 708 are selected and averaged to create a GP image 706, and the GP image is displayed on the GUI. An amount of divergence 715 at a portion where the divergence is large in the shape comparison between the inspection image 705 and the created GP image 706 is obtained.

Moreover, the variation for each pixel of a selected reference image or a difference between the maximum value and the minimum value may be added on top of a defect detection threshold at the time of inspection. Thus, at a position where the variation is large even between the selected reference images, the defect detection threshold becomes on the high side and thus the generation of a false report in this position is suppressed.

Moreover, the above-described index value may be calculated for each inspection image of each die at the time of inspection, and a correction value proportional to this index value may be added on top of the defect detection threshold at the time of inspection. Thus, the degree that the inspection image of each die diverges from the GP image can be reflected on the defect detection threshold, and the biasing in occurrence of a false report between dies within the wafer surface can be adjusted.

Figure 8:
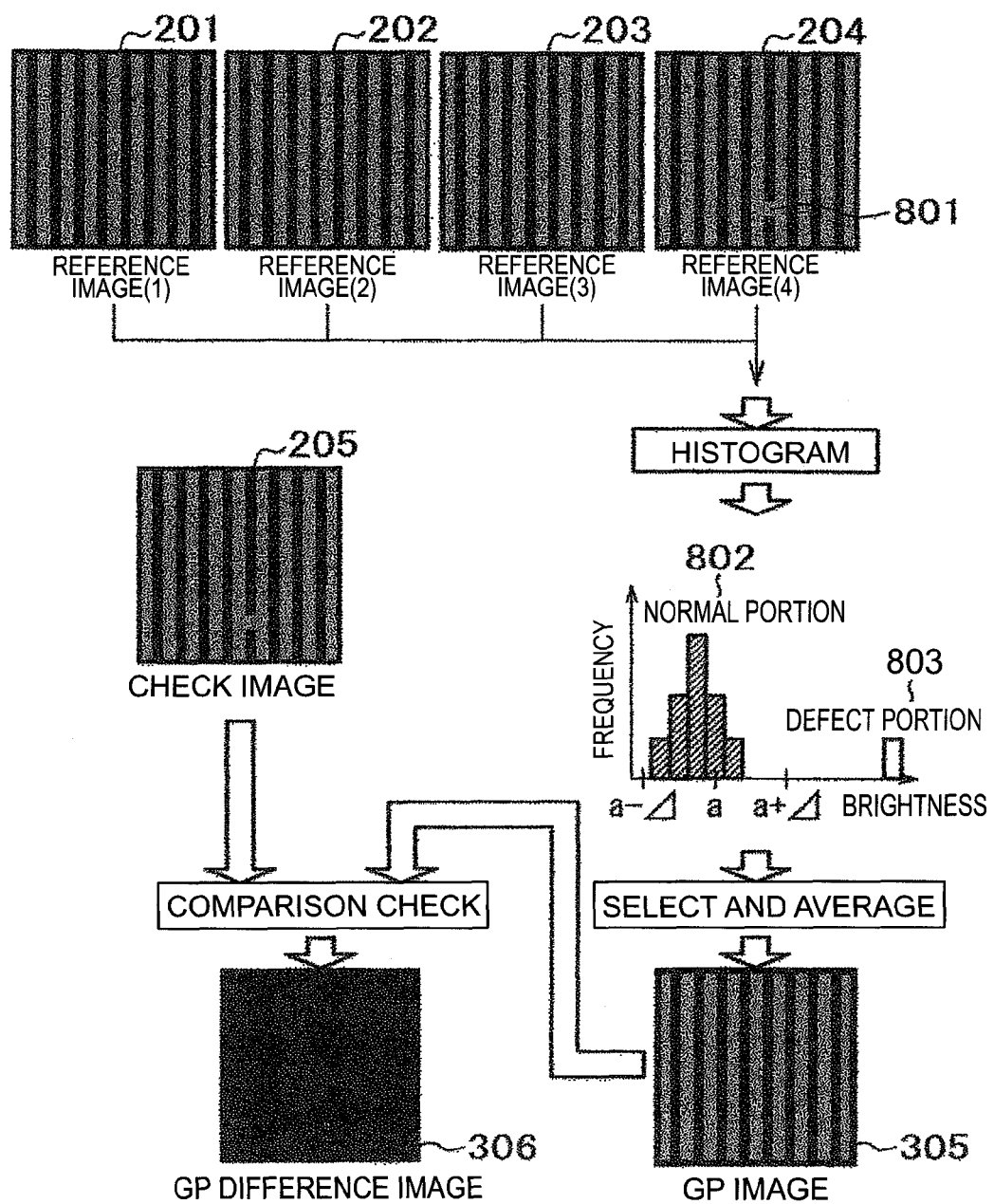
FIG. 8 is a view illustrating the procedure of removing an outlier for each pixel in Embodiment 2.

Moreover, in selecting and averaging only the reference images corresponding to the appropriate range 308, an outlier may be eliminated for each pixel. An example of the concept of the outlier elimination for each pixel is shown in FIG. 8. A histogram of brightness values is calculated for each pixel of the reference image (1) 201, the reference image (2) 202, the reference image (3) 203, and the reference image (4) 204, respectively. At this time, because the reference image (1) 201, the reference image (2) 202, and the reference image (3) 203 do not have a defect but the reference image (4) 204 has a defect 801, a histogram 206 of the pixels corresponding to defective positions is split into a normal portion 802 and a defective portion 803 and plotted. The average brightness value is designated by "a", and the defective portion may be removed as outliers by using the values in a range from $a-\Delta$ to $a+\Delta$ and thus the normal portion may be selected and averaged to create the GP image 305 without a defect. The one obtained by the comparison check between the inspection image 205 and the created GP image 305 is the GP difference image 306.

Figure 9:
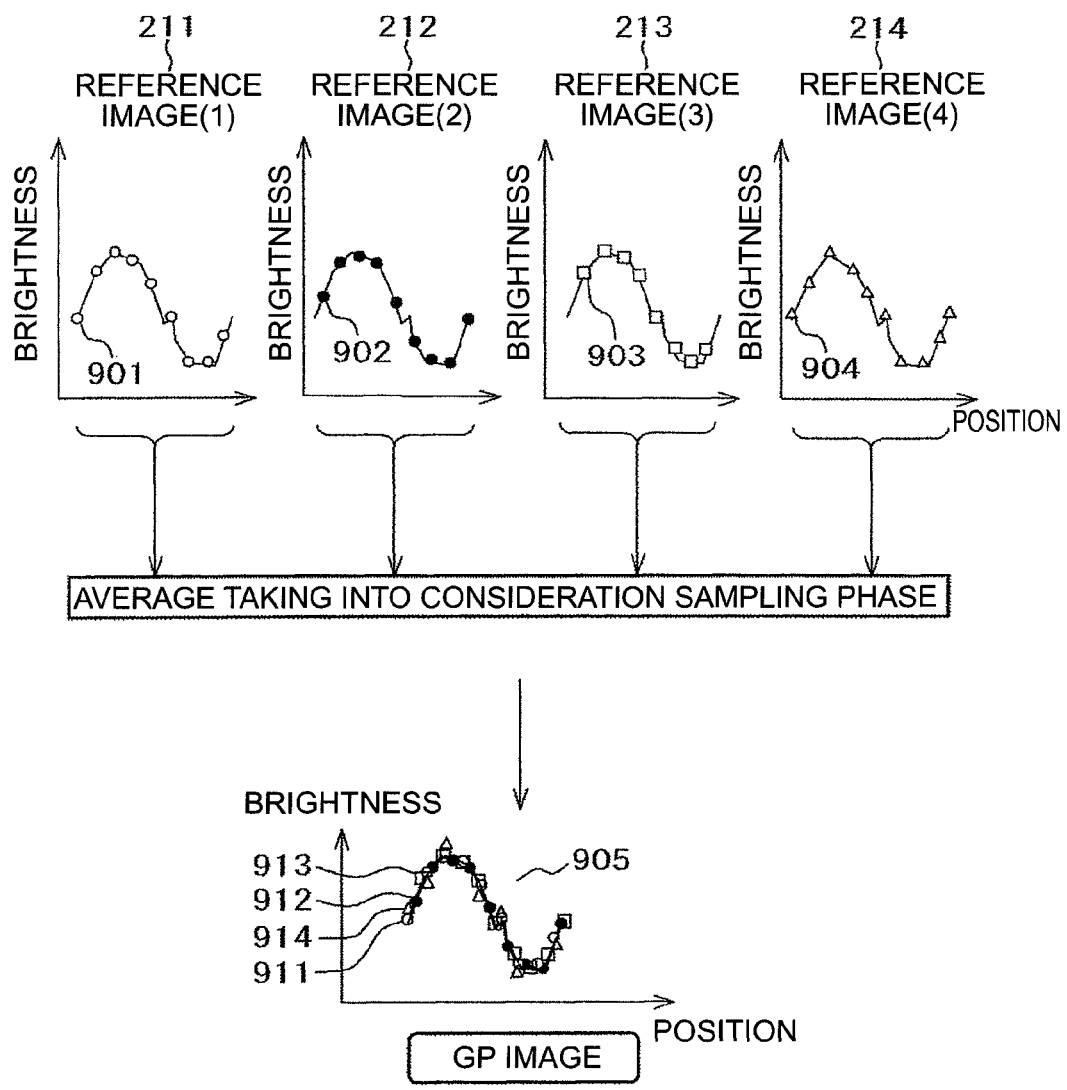
FIG. 9 is a view illustrating the procedure of averaging reference images in Embodiment 2.

Next, an example of the concept of the averaging of reference images is shown in FIG. 9. Here, a one-dimensional waveform is used for ease of description. The reference waveform (1) 211, the reference waveform (2) 212, the reference waveform (3) 213, and the reference waveform (4) 214 are basically the same. While each waveform is sampled and digitally imaged for each pixel size, the phase of each waveform deviates from each other. Therefore, there is a deviation in the sampling position between these waveforms. Then, in averaging the reference images, the reference waveforms are combined into one GP waveform taking into consideration the deviation in phase. For example, at the left end of each reference image, there are a sampling point (1) 901, a sampling point (2) 902, a sampling point (3) 903, and a sampling point (4) 904. In combining the reference waveforms into one GP waveform 905, the reference waveforms are preferably positioned to a composition position (1) 911, a composition position (2) 912, a composition position (3) 913, and a composition position (4) 914 and combined into the average image taking into consideration the deviations in phase.

Figure 10:
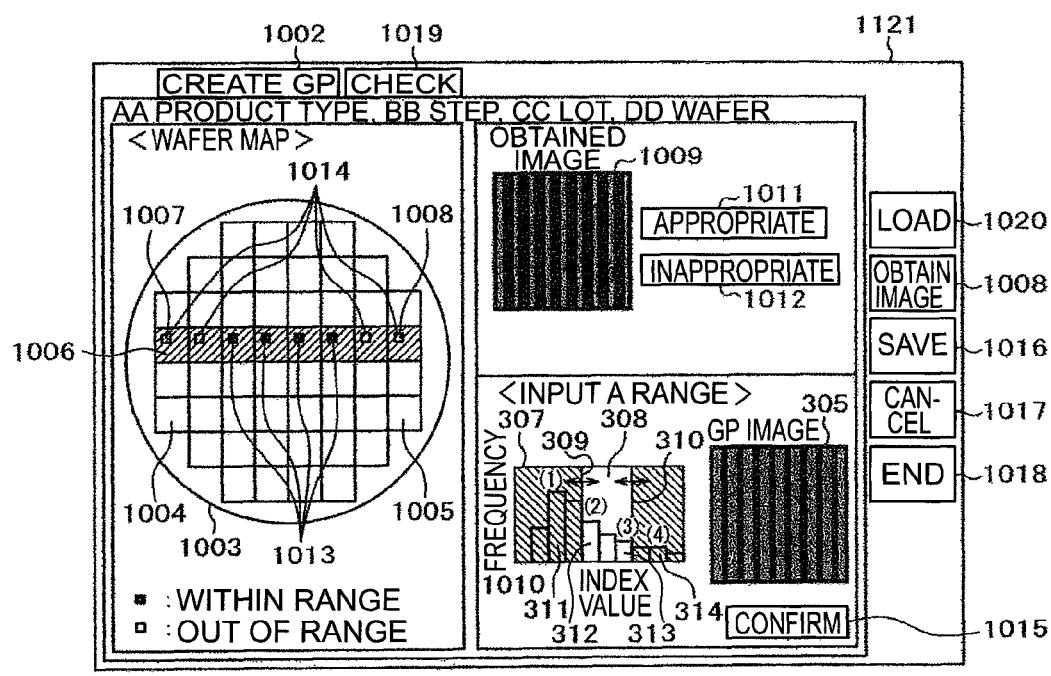
FIG. 10 is a view showing a GUI for inputting a range in Embodiment 2.
Figure 11:
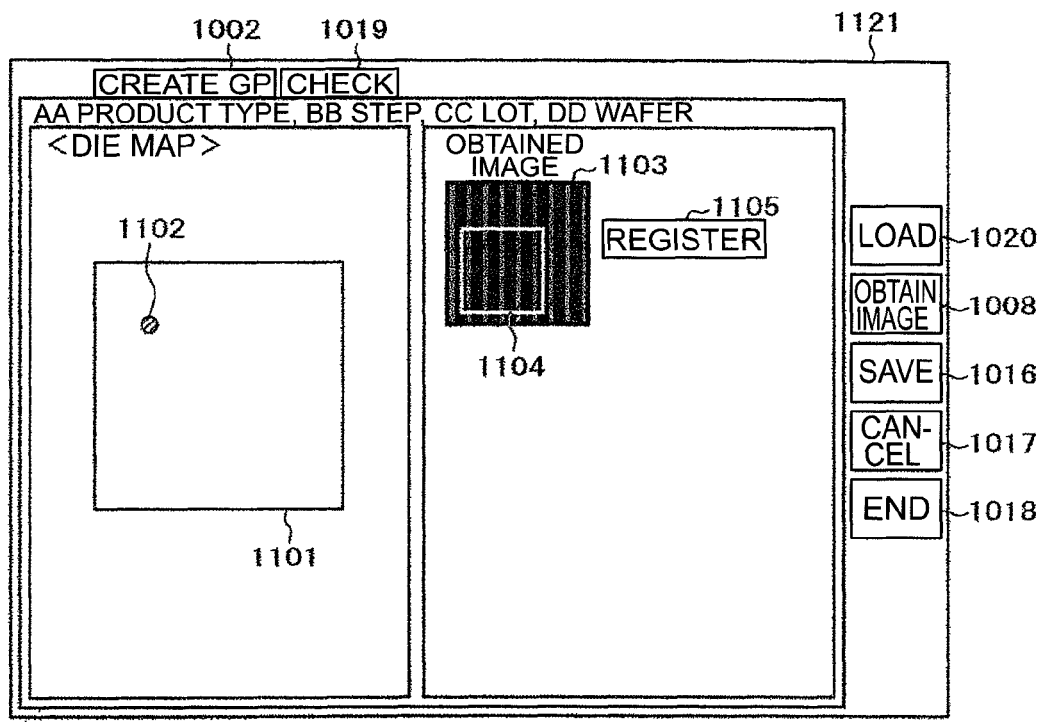
FIG. 11 is a view showing a GUI for setting an inspection region in advance in Embodiment 2.

An example of a GUI for a user to input an appropriate range on a histogram is shown in FIG. 10. Once a user clicks a GP generation tab 1002 on the GUI screen 112, this screen is displayed. On a wafer map 1003, there is displayed a chip layout 1005 in which dies 1004 are arranged in a grid form on a wafer. Once a user clicks a die 1006 used for GP generation on the wafer map 1003, the die 1006 used for GP generations is displayed in a different color. A preset inspection region 1007 is displayed in each die. Once a user clicks an image acquisition button 1008, an image of the inspection region 1007 on a die 406 used for GP generation is obtained. Alternatively, when there is an already-obtained image, once a user clicks a load button 1020, the image of the inspection region 1007 on the die 1006 used for GP generation is loaded. These images correspond to the above-described reference images. For each obtained reference image, an index value, e.g., a line width, is calculated. The histogram 307 calculated from the index value is displayed.

Next, when a user clicks and specifies a certain inspection region 1008 on the wafer map 1003, this inspection region 1008 will be blinked and displayed. Moreover, an image 1009 obtained at the specified position is displayed, and a portion 1010 corresponding to an index value of this image on the histogram blinks. A user confirms the obtained image 1009 and determines whether or not the obtained image 1009 is appropriate for use for GP generation. When it is determined as appropriate, a user clicks an "appropriate" button 1011, while when it is determined as inappropriate, a user clicks an "inappropriate" button 1012. When it is determined as inappropriate, the range lower limit 309 is adjusted so that a corresponding portion 1010 will not fall in an appropriate range 308. On the contrary, when it is determined as appropriate, the range lower limit 309 is adjusted so that the corresponding portion will fall in the appropriate range 308. A user repeatedly specifies an inspection portion and determines whether an obtained image of the specified portion is appropriate or inappropriate, thereby also adjusting a range upper limit 310 and defining the appropriate range 308. In the example of FIG. 10, an index value (1) 311 corresponding to the reference image (1) 201 is inappropriate, an index value (2) 312 corresponding to the reference image (1) 202 is appropriate, and the range lower limit 309 is adjusted therebetween. Moreover, an index value (3) 313 corresponding to the reference image (3) 203 is appropriate, an index value (4) 314 corresponding to the reference image (4) 204 is inappropriate, and the range upper limit 310 is adjusted therebetween. Moreover, when the appropriate range 308 is desired to be finely adjusted, a user may drag and adjust the range lower limit 309 and the range upper limit 310.

On the wafer map 1003 in response to the adjustment of the appropriate range 308, an appropriate inspection region 1013 corresponding to a reference image within the appropriate range 308 is displayed in black. An inappropriate inspection region 1014 corresponding to a reference image out of the appropriate range 308 is displayed in white.

Next, when a user clicks a confirmation button 1015 on the GUI screen 1121, the GP image 305 obtained by selecting and averaging only the reference images in the appropriate range 308 defined in the above-described procedure is displayed. A user watches the GP image 305, and if it is appropriate, a user clicks a save button 1016 to store the GP image 305. A user watches the GP image 305 and if it is not appropriate, a user clicks a cancel button 1017 to cancel the GP image 305. Upon completion of GP image generation through the above procedure, a user clicks an end button 1018 to complete the GP image generation. When a user clicks an inspection tab 1019 on the GUI screen 1121, the procedure transitions to an inspection process.

An example of the procedure of presetting the inspection region 1007 prior to the above-described GP generation is shown in FIG. 611. When a user double-clicks the die 1006 used for setting an inspection region on the GUI screen 1121, the procedure transitions to a die map 1101. When a user clicks a position desired to inspect on the die map 1101, an inspection position 1102 is displayed. When a user clicks an image acquisition button 1008, an image around the inspection position 1102 is obtained and an obtained image 1103 is displayed. A region which a user dragged on the obtained image 1103 is displayed as a rectangular area 1104. When a user clicks a registration button 1105, the coordinate of the rectangular area 1104 is set as an inspection region 1107.

Figure 12:
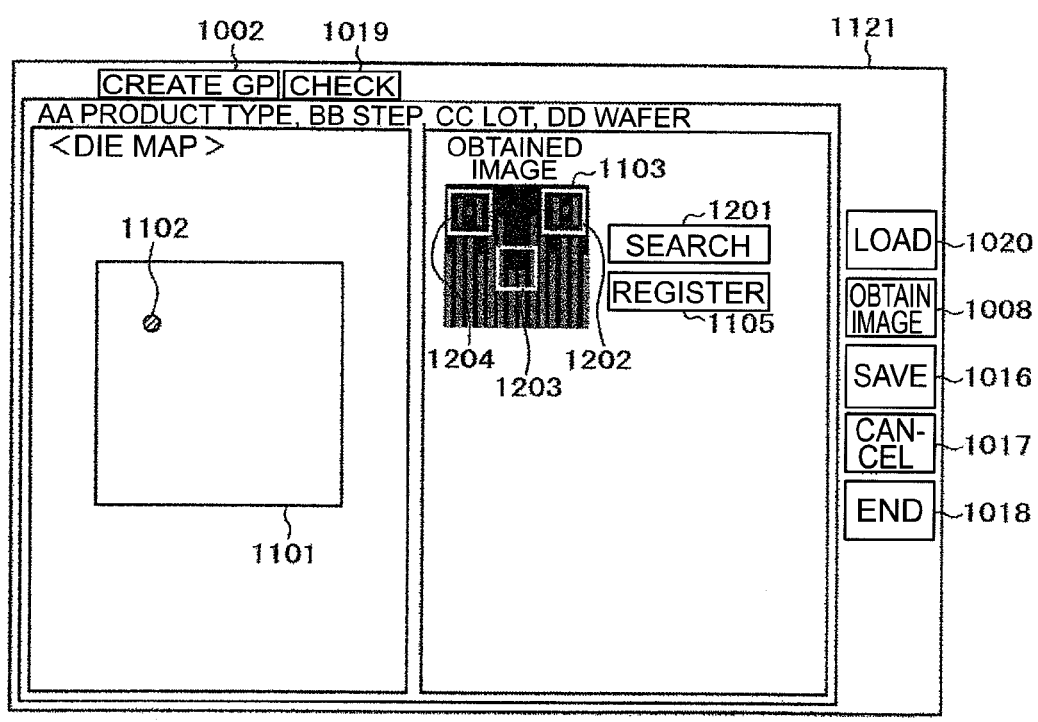
FIG. 12 is a view showing a GUI for setting an inspection region in Embodiment 2.

Another example of the procedure of setting the inspection region 1107 is shown in FIG. 12. In a logic section of a semiconductor wafer, there is no repeatability in the circuit pattern. Therefore, it is necessary to pinpointedly specify an inspection region on an obtained image. For example, a user drags and specifies a small area like a rectangular area C1203 on the obtained image 1103.

Here, a plurality of inspection regions may be present on the obtained image. When a user clicks a search button 1201 while the rectangular area 1204 is being set on the obtained image 1103, a similar circuit pattern is searched on the obtained image 1103, with the rectangular area 1204 as a template, and a rectangular area B1202 is displayed at a position where the same circuit pattern has been detected. Here, for search of a pattern, an approach, such as a commonly-used pattern matching method, may be used.

Figure 13:
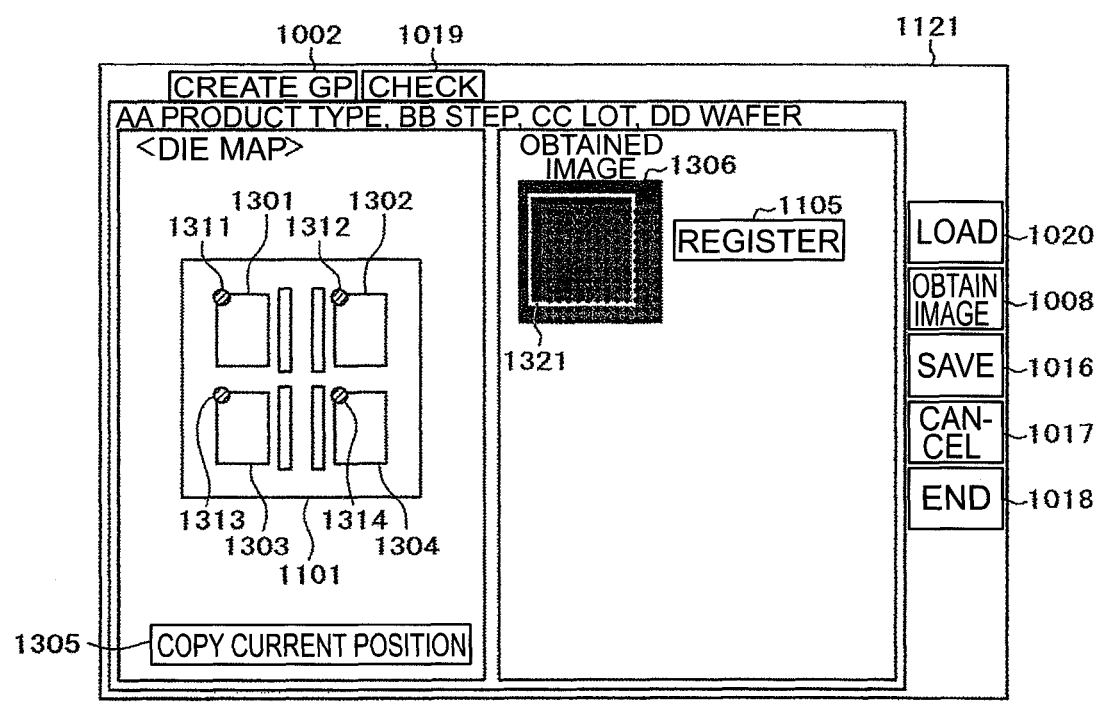
FIG. 13 is a view showing a GUI for setting an inspection region in Embodiment 2.

Moreover, FIG. 13 shows another example of the procedure of setting an inspection region when a reference image is obtained from a plurality of places within a die as shown in FIG. 6. In this case, for example, a reference image may be obtained from a corner part of a memory area of a semiconductor wafer. Because there are a memory area (1) 1301, a memory area (2) 1302, a memory area (3) 1303, and a memory area (4) 1304 on the die map 1101, a plurality of corner parts of the memory area that are the identical pattern are present. For example, when a user clicks the upper left corner of the memory area (1) 1301 as a position desired to inspect, an inspection position (1) 1311 is displayed.

Next, when a user clicks an inspection position copy button 1305, then an inspection position (2) 1312, an inspection position (3) 1313, and an inspection position (4) 1314 are displayed at the upper left corner of each memory area. The position of the memory area may be calculated from design information.

Next, when a user clicks the image acquisition button 1008, then images around the inspection position (1) 1311, the inspection position (2) 1312, the inspection position (3) 1313, and the inspection position (4) 1314 are obtained, and an obtained image (1) 1321 corresponding to the inspection position (1) 1311 is displayed. Here, when a user clicks the inspection position (2) 1312, the inspection position (3) 1313, and the inspection position (4) 1314, then an obtained image (2), an obtained image (3), and an obtained image (4) are displayed.

Next, when a user drags on the obtained image (1) 1321, this area is displayed as a rectangular area 1306. When a user clicks the registration button 1105, the coordinate of the rectangular area 1306 is set as an inspection region.

Because there are four corners of the memory area: the upper left corner, the upper right corner; the lower left corner; and the four lower right corner, the inspection region is set in a similar manner, respectively. The above is just an example of the GUI display, and other display form may be used.

Figure 14:
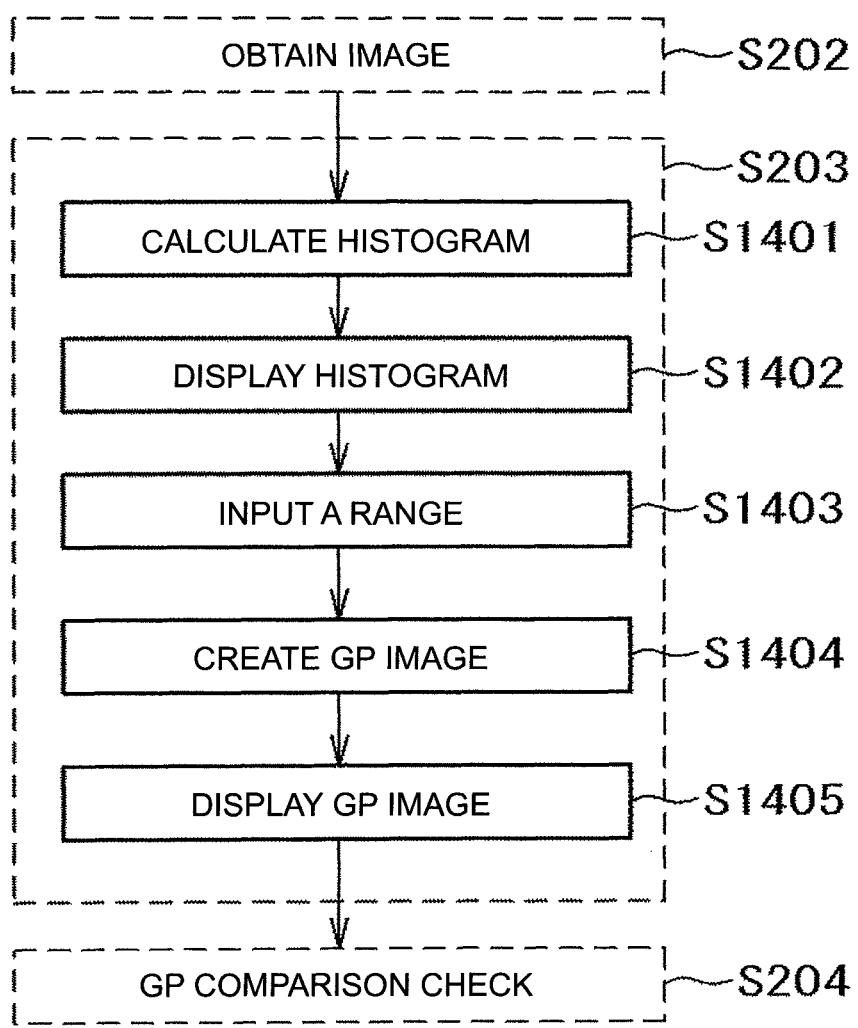
FIG. 14 is a flow diagram showing the procedure of a method for performing a comparison check in Embodiment 2.

In summary, as a detailed step of the GP image generation Step S204 among the inspection flow described in FIG. 2, an example of the procedure of a method for performing comparison check using an appropriately-set GP image is shown in FIG. 14.

First, an index value (e.g., the dimension of a pattern) of each reference image having the same pattern as that of the inspection image, which is obtained in the SEM image acquisition step of S202 of FIG. 2 and stored in the storage unit 113, is calculated and its histogram is created (S1401), and the histogram is displayed on the display screen 1121 (S1402). Next, an appropriate range corresponding to the range 308 of FIG. 3 or the range 708 of FIG. 7 is input on the histogram (S1403). Next, an average image (GP image) is created by selecting and averaging only the reference images corresponding to the input range (S1404), and the created GP image is displayed on the display screen 1121 (S1405). This completes the GP image generation Step 203, and next the GP comparison check step of S204 of FIG. 2 is performed.

According to the embodiment, even when a circuit pattern has a large variation, a comparison check using an appropriately-set average image enables an inspection suppressing a false report.

Embodiment 3

Figure 15:
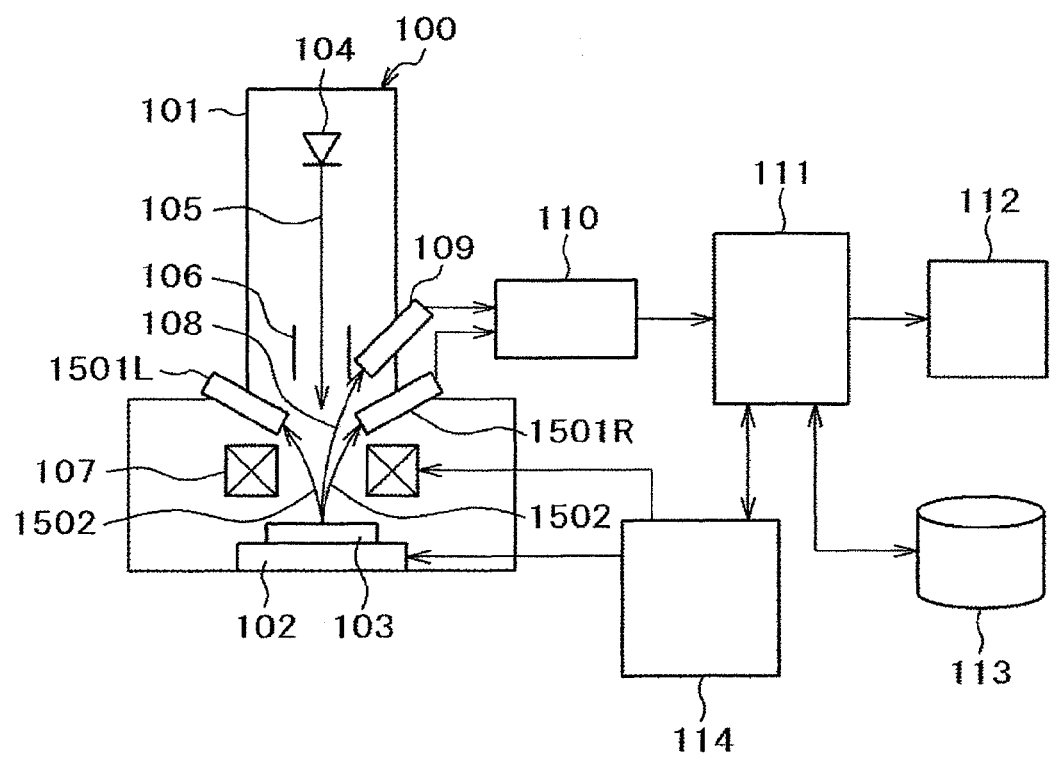
FIG. 15 is a view showing a schematic configuration of a defect inspection device using a SEM in Embodiment 3.

FIG. 15 shows another example of the configuration of a defect inspection device (defect review SEM device) using a SEM in the embodiment. The defect inspection device of FIG. 15 has the configuration of the defect inspection device of FIG. 1 plus a pair of back-scattered electronic detectors 1501. A pair of back-scattered electronic detectors 1501 are installed in different directions, and are preferably installed in a point-symmetric relation with the irradiation position of a beam (hereinafter, these are referred to as a left-side back-scattered electronic detector (back-scattered electronic detector L) and a right-side back-scattered electronic detector (back-scattered electronic detector R)). In the view, an example of the defect inspection device with two back-scattered electronic detectors is shown, however the number of back-scattered electronic detectors can be increased or reduced.

The electron beam microscope 100 includes: the table 102 movable within a plane inside the enclosure 101, the electron-gun 104 emitting the electron beam 105; the deflector 106 deflecting the electron beam 105 emitted from the electron-gun 104; the electron lens 107 adjusting the focusing position of the electron beam 105; and the detector 109 that detects the secondary electron 108 generated from the semiconductor wafer 103 scanned by and irradiated with the electron beam 105 whose focusing position is adjusted by the electron lens 107, in synchronization with a deflection signal by the deflector 106. The secondary electron detected by the detector 109 and a back-scattered electron 1502 detected by back-scattered electronic detectors 1501L and 1501R are converted to an electric signal, respectively, and then is further converted to a digital image signal by the A/D converter 110, and is input to the processing unit 111 and subjecting to image-processing.

In the defect inspection device with the above-described configuration, based on the positional information about the inspection region on the semiconductor wafer 103 that is stored in advance in the storage unit 113, the general control unit 114 drives the table 102 so that an inspection region on the semiconductor wafer 103 enters the inspection field of view of the detector 109 of the electron beam microscope 100. Next, the general control unit 114 controls the electron beam microscope 100 to obtain an alignment pattern image within this inspection field of view, and compares the same with an alignment pattern registration image, which is registered in advance, to calculate the position of the inspection region. Next, the calculated position of the inspection region is imaged by the electron beam microscope 100 to obtain a secondary electron image and a back-scattered electron image of the inspection region, and these images are compared with a GP, which is registered in advance, to extract a defect. Finally, the feature quantity on the image of this extracted defect is extracted, and the defect is classified based on a predetermined rule.

In the back-scattered electron image, for the detection intensity, the intensity of the detected back-scattered electron is determined depending on a relationship between the direction, in which the detector detects the back-scattered electron, and a direction perpendicular to the surface of an object irradiated with electrons. Therefore, the gradient of the surface of an object can be estimated based on a back-scattered electron intensity distribution and thus the shape can be easily estimated. For this reason, the index value calculated from an image may be the shape of an object, e.g., the height of a circuit pattern.

Figure 16:
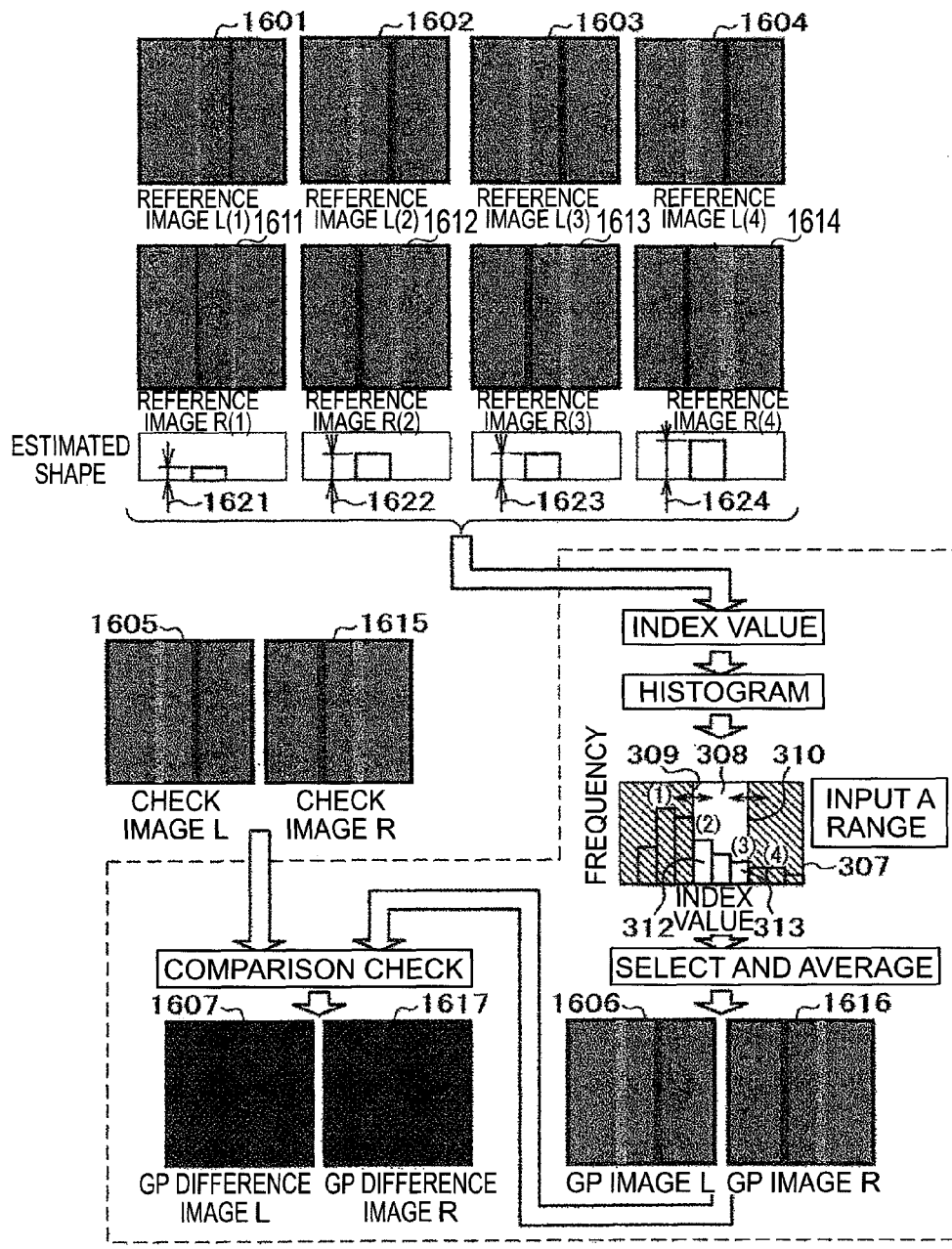
FIG. 16 is a view illustrating the procedure of a GP image generation method in Embodiment 3.

The procedure of a GP image generation method according to the configuration is shown in FIG. 16. The corresponding portions of a plurality of dies on a wafer are imaged by the review SEM to obtain a reference image comprising two back-scattered electron images detected by the back-scattered electronic detectors 1501L and 1501R. That is, in the view, a reference image L(1) 1601, a reference image L(2) 1602, a reference image L(3) 1603, and a reference image L(4) 1604 of the back-scattered electron detected by the back-scattered electronic detector 1501L as well as a reference image R(1) 1611, a reference image R(2) 1612, a reference image R(3) 1613, and a reference image R(4) 1614 of the back-scattered electron detected by the back-scattered electronic detector 1501L are obtained. The obtained images are stored into the storage unit 113.

An index value is calculated for each reference image stored in the storage unit 113. This index value may be, for example, the height calculated from the estimated shape of a circuit pattern. In the view, the height corresponding to each reference image is a height (1) 1621, a height (2) 1622, a height (3) 1623, and a height (4) 1624, respectively. The histogram 307 is calculated from the calculated index value and displayed on the GUI. While in the view, only four reference images, reference waveforms, and line widths are illustrated, respectively, reference images for more dies may be obtained. The histogram 307 in the view represents a histogram of the index values calculated for more dies.

Next, a user inputs the appropriate range 308 on the histogram 307. The appropriate range 308 is a range of the index values corresponding to the reference images suitable for use to create a GP image. Here, a user adjusts the range lower limit 309 so that the index value (2) 312 corresponding to the reference images, i.e., the reference image L(2) 1602 and the reference image R(2) 1612 in this view, which a user determines to be close to the ideal state among a plurality of reference images, are included in the appropriate range 308. Similarly, a user adjusts the range upper limit 310 so that the index value (3) 313 corresponding to the reference image L(3) 1603 and the reference image R(3) 1613 is included in the appropriate range 308.

Next, only the reference images corresponding to the input appropriate range 308, i.e., the reference image L(2) 1602, the reference image R(2) 1612, and the reference image L(3) 1603, the reference image R(3) 1613 in the view, are selected and averaged to create a GP image L1606 and a GP image R1616, and the created GP image L1606 and GP image R1616 are displayed on the GUI. Because the GP image L1606 and the GP image R1616 are displayed on the GUI, a user can confirm the validity thereof.

The ones obtained by comparison check between the inspection image L1605, the inspection image R1615, and the created GP image L1606 and GP image R1616 are a GP difference image L1607 and a GP difference image R1617. Image processing is performed on this difference image to detect a defect.

Embodiment 4

Figure 17:
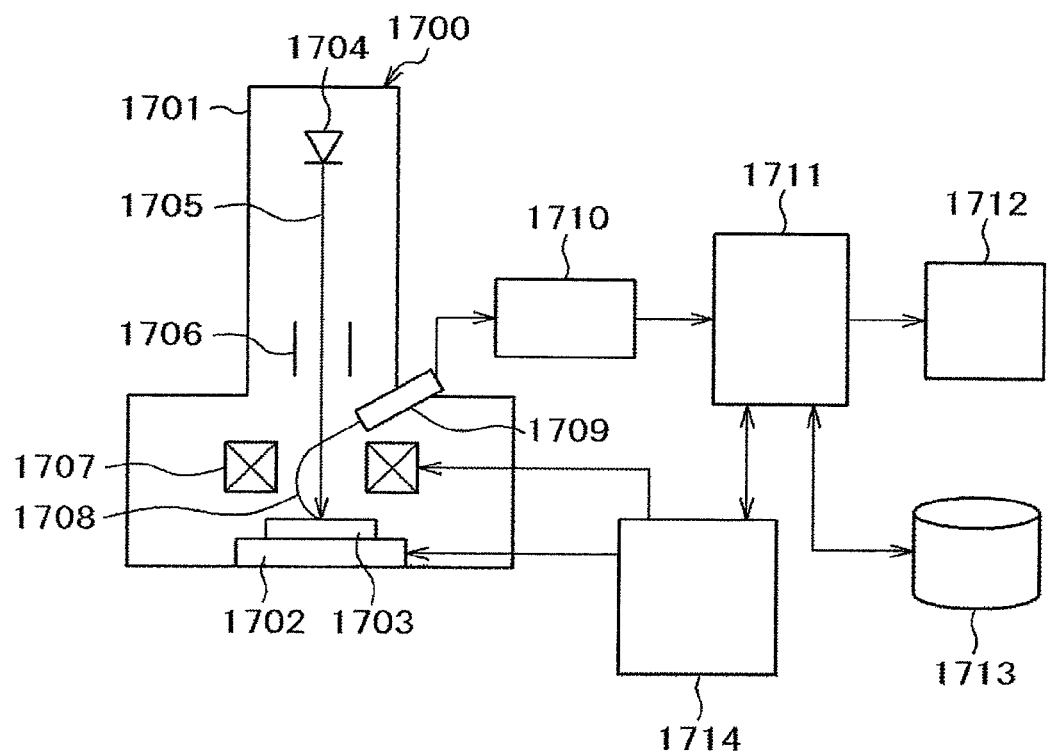
FIG. 17 is a block diagram showing a schematic configuration of an inspection device in Embodiment 4.

An example is described, wherein the present invention is applied to an inspection device using a SEM. An example of the configuration of the inspection device according to the embodiment is shown in FIG. 17. This inspection device determines the presence/absence of a defect by processing an image, which is obtained by imaging a semiconductor wafer with a scanning electron microscope, with an image processing circuit.

The device mainly comprises: an electron-gun 1701 generating an electron beam 1702; a deflector 1703 deflecting the electron beam 1702 from the electron-gun 1701 to the X direction; an objective lens 1704 converging the electron beam 1702 onto a semiconductor wafer 1705; a stage 1706 continuously moving the semiconductor wafer 1705 to the Y direction in synchronization with the deflection of the electron beam 1702; a detector 1708 detecting a secondary electron 1707 or the like from the semiconductor wafer 1705; an A/D converter 1709 A/D-converting a detection signal to a digital image; an image processing circuit 1710 comprising electric circuits, such a plurality of processors and FPGAs, that process a detected digital image and a digital image at a location, where the digital image is expected to be essentially the same as the detected digital image, and compare the both to determine a location, where there is a difference between the both, as a defect candidate; a detection condition control unit 1711 that controls the portions involving in forming images, such as the electron-gun 1701, the deflector 1702, the objective lens 1704, the detector 1708, and the stage 1706; an image processing control unit 1712 controlling the image processing circuit; a general control unit 1713 controlling the whole inspection device; a data storage unit 1714 storing inspection conditions and inspection images; and a user interface unit 1715 displaying the inspection images on the screen 401 of the GUI. These are coupled to each other so as to be able to exchange data as required.

In imaging the semiconductor wafer 1705, which is a sample, using a SEM-type semiconductor wafer inspection device with the above-described configuration, the electron beam 1702 emitted from the electron-gun 1701 is repeatedly deflected to the X direction at a certain cycle by means of the deflector 1703, and is converged by the objective lens, and is focused onto the surface of the semiconductor wafer 1705, which is being moved to the Y direction at a certain speed by the stage 1706, and the surface of the semiconductor wafer 1705 is scanned in synchronization with the movement to the Y direction by the stage 1706. In this manner, the secondary electron (also including the back-scattered electron) 1707 generated from the semiconductor wafer 1705 irradiated with and scanned by the electron beam 1702 is detected by the detector 1708, and is converted to a digital signal by the A/D converter 1709 to obtain an inspection image, and the image processing circuit 1710 performs image processing by comparing this inspection image with the already-stored reference image and extracting a difference, thereby detecting a defect.

Embodiment 5

Figure 18:
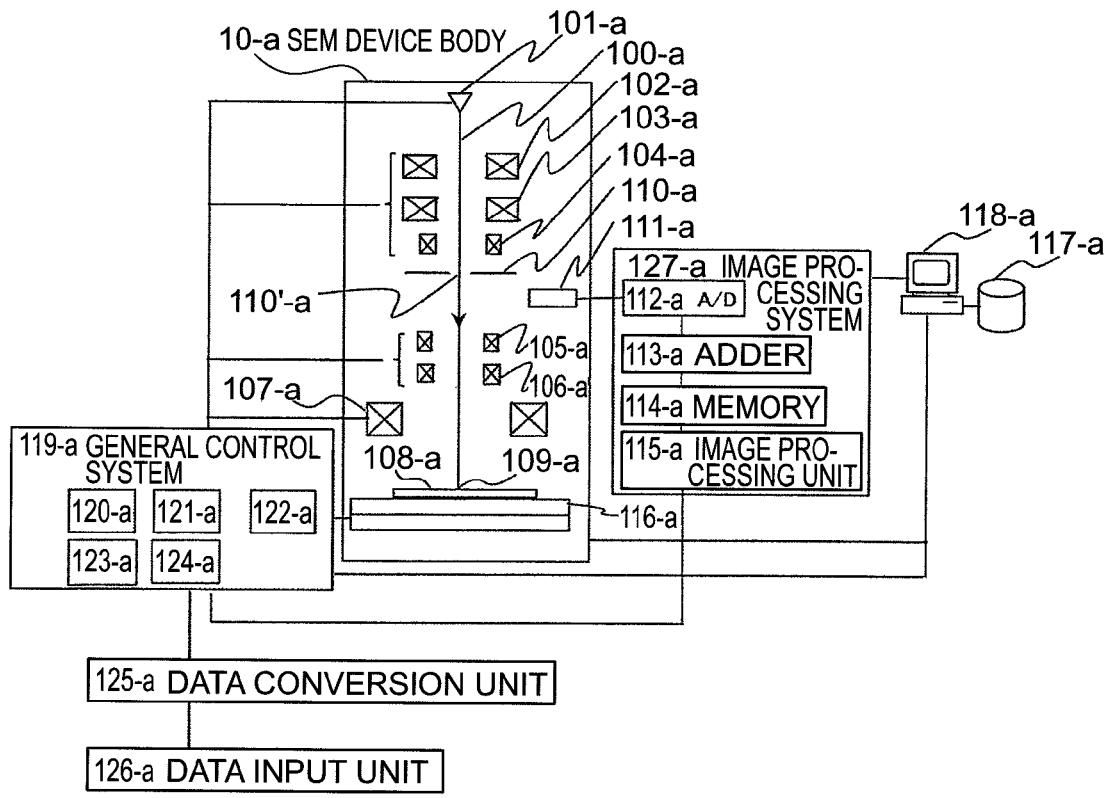
FIG. 18 is a configuration diagram of Embodiment 5 of the present application.

FIG. 18 shows the overall configuration of an inspection device used in a fifth embodiment. A SEM device body 10-*a* includes the following electro-optical system and detection system. An electron-gun 101-*a* emits an electron beam 100-*a*. The emitted electron beam 100-*a* passes through electron lenses 102-*a* and 103-*a*, and then the astigmatic aberration and/or misalignment of the electron beam 100-*a* are corrected by an electron beam axis aligner 104-*a*. Two stages of deflectors 105-*a* and 106-*a* deflect the electron beam 100-*a* and control the position that is irradiated with the electron beam 100-*a*. The deflected electron beam 100-*a* is converged by an objective lens 107-*a*, and a region to be imaged 109-*a* of a wafer 108-*a* is irradiated with the converged electron beam 100-*a*. From the region to be imaged 109-*a* irradiated with the converged electron beam 100-*a*, the secondary electron and back-scattered electron are emitted, and the secondary electron and back-scattered electron collide with a reflective plate 110-*a* having a primary electron beam through-hole 110'-a, and the secondary electron generated here is detected by an electronic detector 111-*a*.

The secondary electron and back-scattered electron detected by the detector 111-*a* are converted to a digital signal by an A/D converter 112-*a* of an image signal processing system 127-*a*, and are stored into a memory 114-*a*. Note that an adder circuit 113-*a* may be arranged between the A/D converter and the memory. In raster-scanning the electron beam 100-*a* on the region to be imaged 109-*a*, the adder circuit 113-*a* calculates an arithmetic average (frame average) of the detection signal obtained at a position irradiated with the same beam, thereby enabling to reduce shot noise and obtain a high S/N image. An image processing unit 115-*a*, for example, extracts an abnormal portion, measures the dimension of the extracted abnormal portion, and calculates the appearance feature of the abnormal portion using the image stored in the memory 114-*a*. In order to enable the generation of a golden pattern image with the use of the data representing a pattern layout design to be described later, data representing a pattern layout design or data obtained by converting this data is permitted to be input to the image processing unit 115-*a*. The image processing unit 115-*a* has a function to calculate the amount of correction of an imaging positional offset in SEM-imaging from a matching between a SEM image and data representing a pattern layout design or data obtained by converting this data. As this method, specifically a method is used, wherein a position at which the maximum value of a normalized correlation value is obtained is calculated as a position at which the design data matches with the data representing a pattern layout design. However, other method may be used.

An XY stage 116-*a* moves the wafer 108-*a* mounted thereon, thereby enabling the image capturing at any position on the wafer 108-*a*. A secondary storage unit 117-*a* can store the image being stored in the memory 114-*a*. Moreover, an abnormal portion of the region to be inspected 109-*a* and the appearance feature of the abnormal portion obtained by image processing can be also stored into the memory 114-*a*. A computer terminal 118-*a* can display an image stored in the secondary storage unit 117-*a* or the memory 114-*a*. By inputting to a terminal 118-*a*, a user can control and set various operations of the SEM device body 10-*a*, an image processing system 127-*a*, a general control system 119-*a* to be described later, and the like shown in FIG. 18*a*.

Reference numeral 119-*a* represents a general control system, and reference numeral 120-*a* represents a current-amount control unit of the electron-gun 101-*a* of the electron beam 100-*a*. A deflection control unit 121-*a* controls the deflectors 105-*a* and 106-*a*, an electron lens control unit 122-*a* controls the electron lenses 102-*a*, 103-*a*, 104-*a*, and 107-*a*, a stage control unit 123-*a* controls the scrolling due to the movement of the XY stage 116-*a*, and a sequence control unit 124-*a* controls the whole inspection sequence. A data input unit 126-*a* receives the coordinate of the region to be inspected 109-*a* and the data representing a pattern layout design to be compared with a SEM image. A data conversion unit 125-*a* performs data conversion so that the data representing a pattern layout design can be easily compared with the SEM image. Note that a configuration, wherein the terminal 118-*a* is used as the data input unit 126-*a*, may be also employed.

Figure 19:
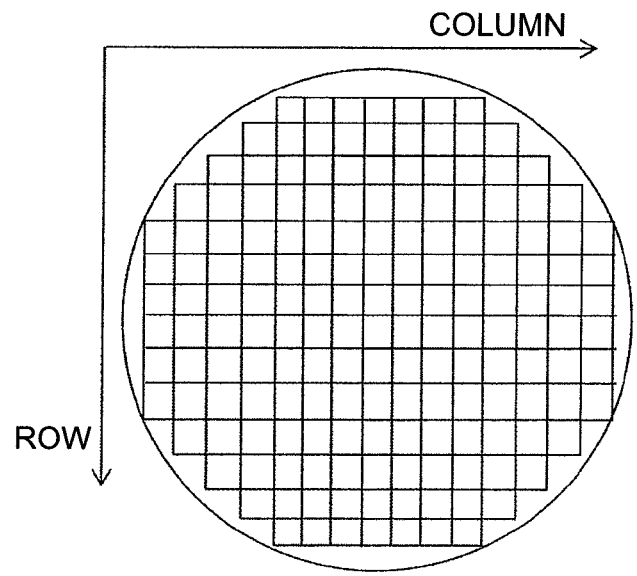
FIG. 19 is a view showing the arrangement of chips on a wafer.
Figure 20:
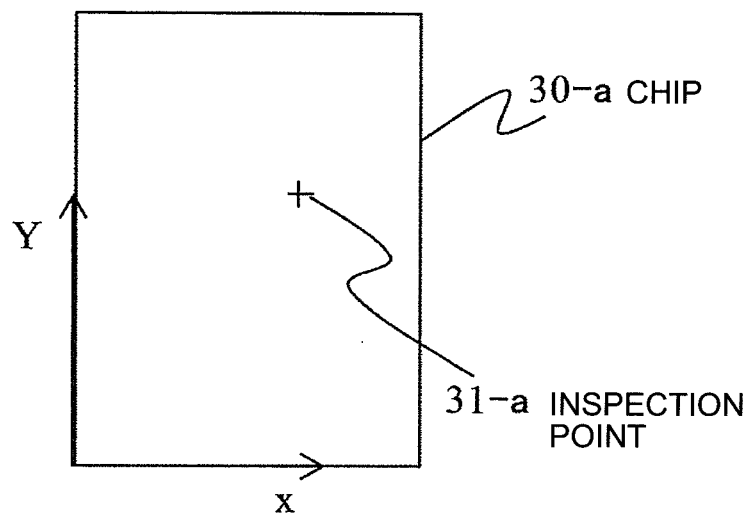
FIG. 20 is a view illustrating a chip and a chip coordinate.
Figure 21:
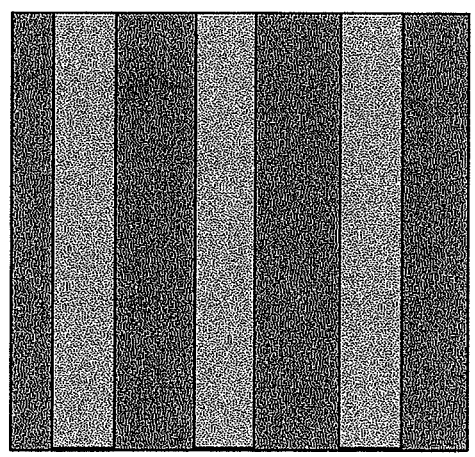
FIG. 21 is a view showing an example of the captured image at an inspection point.

FIG. 19 shows a view when a wafer serving as the object to be inspected is seen from above the upper surface. On the wafer, a large number of chips, which are fabricated so as to have a circuit pattern identical to each other, are arranged in a grid form. Each chip can be specified by row and column numbers as shown in FIG. 19. A chip 30-*a* shown in FIG. 20 is the enlarged one of a large number of chips shown in FIG. 19. An inspection point 31-*a* is specified by a chip coordinate having the point of origin at the lower left of the chip. A wafer coordinate, which is a position on the wafer of the inspection point 31-*a*, can be defined by the row and column numbers of the chip and the chip coordinate. The inspection point within the chip 30-*a* is not limited to one, but a plurality of points, where a pattern is formed so as to be identical to each other within the chip, may be used. Moreover, points, where a pattern is formed so as to be different from each other within the chip, may be specified, respectively, and the corresponding specified point may be inspected for each chip. FIG. 21 represents a captured image at the inspection point 31-*a* of FIG. 20, representing line and spaces in the vertical direction. Note that FIG. 21 is an example of the captured image and the pattern to be imaged is not limited to this. Hereinafter, the capturing and inspecting of images at the same chip coordinate of different chips on the same wafer, or the capturing and inspecting of images at the same chip coordinate of a plurality of predetermined chips across a plurality of wafers is referred to as programmed-point inspection or fixed-point check.

Figure 22:
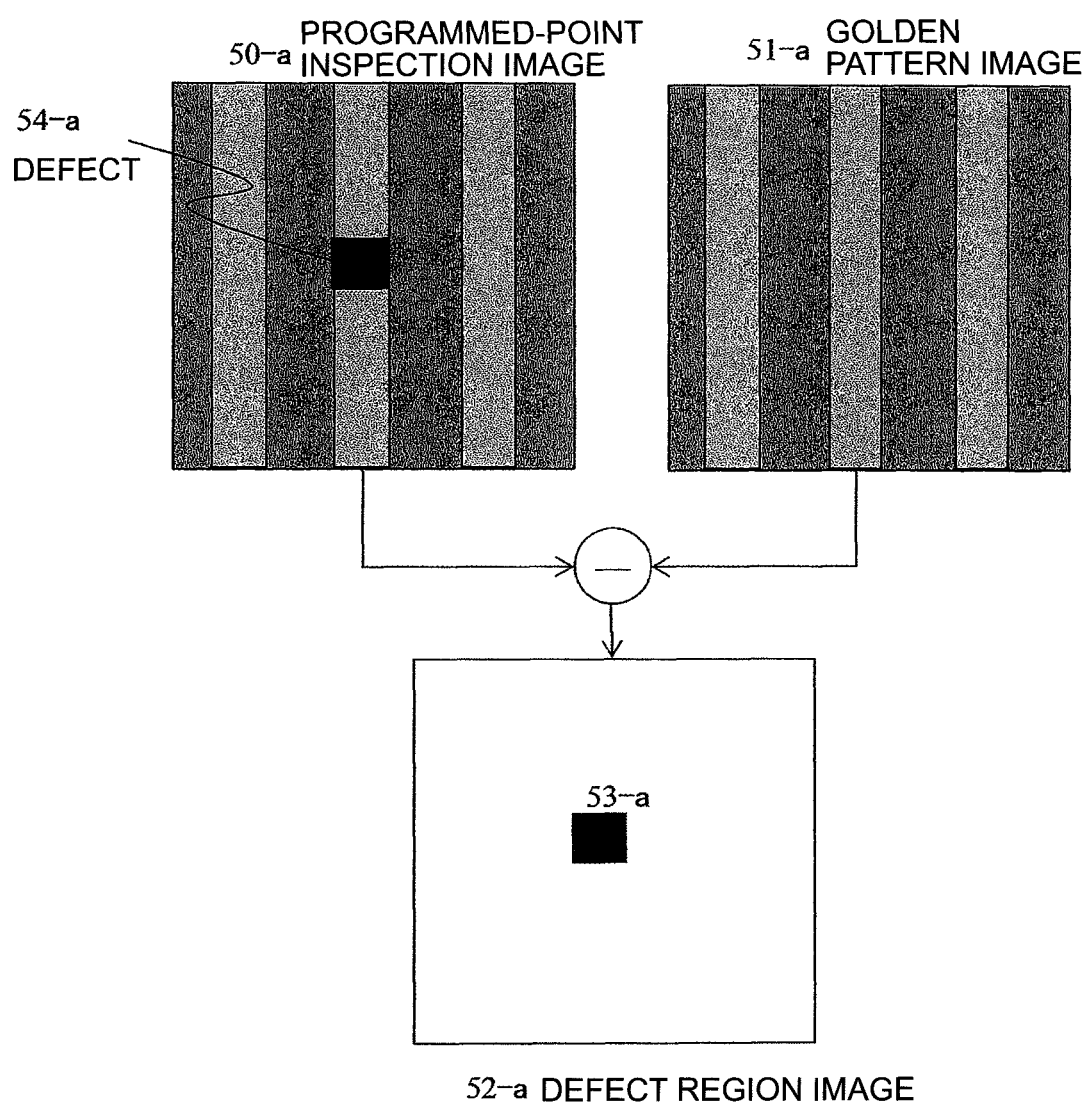
FIG. 22 is a view showing a flow of generating a defect region image.

FIG. 22 is a view showing the overview of a defect region extraction process that is needed when inspecting by image processing. A programmed-point inspection image 50-*a* obtained by the programmed-point inspection is the captured image at the programmed inspection point shown in FIG. 21. However, a defect 54-*a* is generated at the programmed inspection point of FIG. 22, and a programmed-point inspection image 50-*a* shows how the defect 54-*a* is imaged. The extraction of a defect region in the programmed-point inspection image 50-*a* is performed, for example, by performing an image subtraction process with respect to a golden pattern image 51-*a* that does not include a defect. An image having been subjected to the image subtraction process is binarized with an appropriate threshold, thereby creating a defect region image 52-*a* and obtaining a defect region 53-*a*. The defect is characterized using a visual feature of the image of the region on the programmed-point inspection image 50-*a* corresponding to the defect region 53-*a*.

Figure 23:
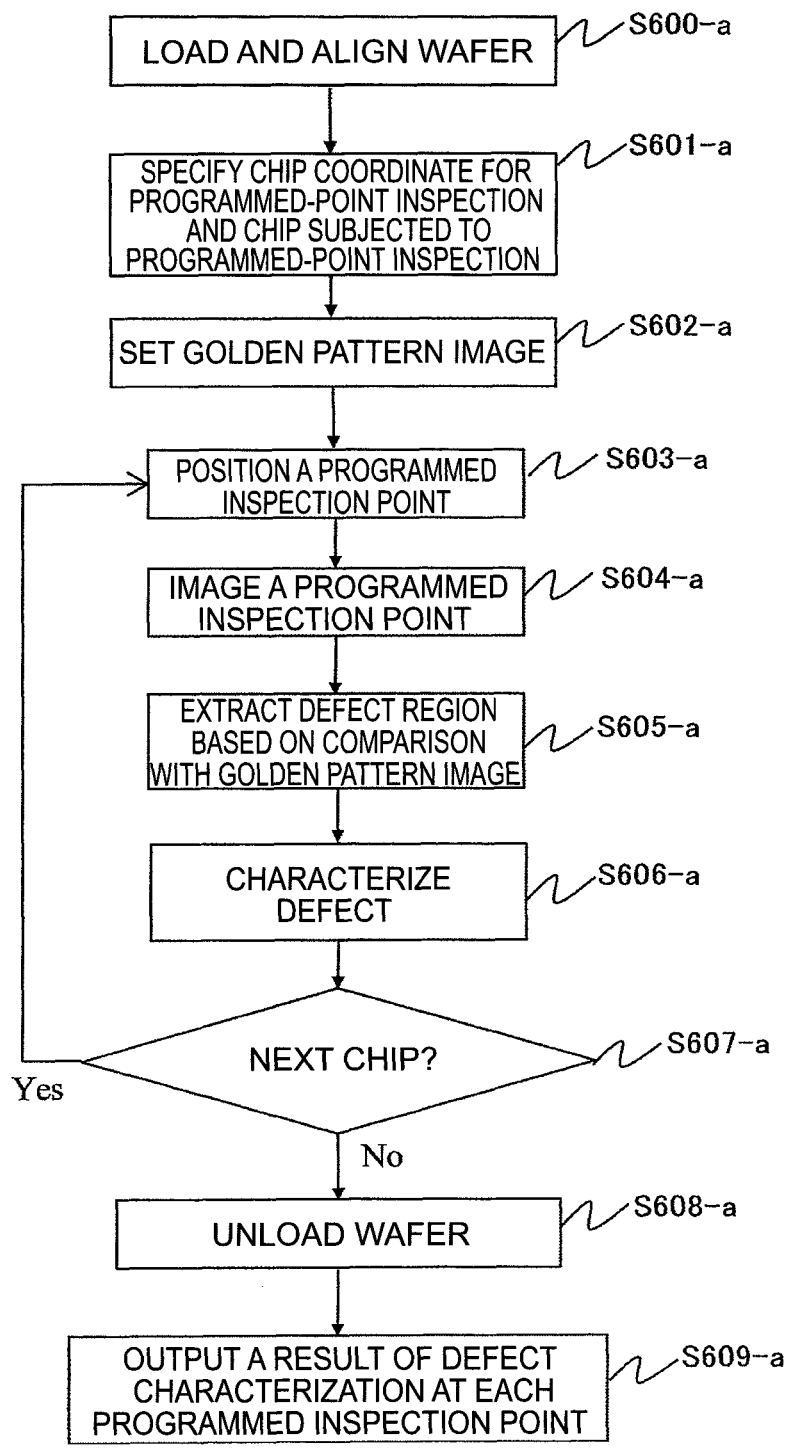
FIG. 23 is a flow diagram of programmed-point inspection.

Next, a flow of the programmed-point inspection is described using FIG. 18 and FIG. 23. First, the wafer 108-*a* is loaded onto the stage 116-*a* of the SEM device body 10-*a* and the wafer coordinate and the coordinate system of the stage 116-*a* are associated with each other using an alignment mark on the wafer (S600-*a*). Next, upon input from the user terminal 118-*a*, the chip coordinate of a programmed inspection point and a chip subjected to programmed-point inspection are specified (S601-*a*). Also hereinafter, necessary inputting is performed via the user terminal 118-*a*. Note that the sequence of Step S600-*a* and Step S601-*a* may be reversed. Next, a golden pattern image is specified (S602-*a*). The golden pattern image is specified by further specifying a chip serving as a reference among the specified chips, and positioning the stage 116-*a* so that the programmed inspection point of the chip serving as a reference is the region to be imaged 109-*a*, and imaging the golden pattern image 51-*a*. The golden pattern image is stored into the memory 114-*a* or the secondary storage unit 117-*a*, and is reused in performing an image subtraction process for the purpose of defect region extraction shown in FIG. 22. When there are a plurality of programmed inspection points within one chip, a golden pattern image may be set for each point, or the programmed inspection points may be grouped for each shape of a circuit pattern to be imaged to set a golden pattern image. That is, a golden pattern image may be set as appropriate. Hereinafter, the steps from S603-*a* to S607-*a* are performed on each chip specified in S601-*a*, and these steps will be repeated with respect to the next chip through the finally specified chip. First, the positioning of the stage 116-*a* is performed so that the programmed inspection point of the specified chip becomes the region to be imaged 109-*a* (S603-*a*). Next, the programmed-point inspection image 50-*a* is imaged and stored into the memory 114-*a* (S604-*a*). In a defect region extraction process (S605-*a*), the programmed-point inspection image 50-*a* stored in the memory 114-*a*, and the golden pattern image 51-*a* stored in the memory 114-*a* or the secondary storage unit 117-*a* are used, and the image subtraction process of both images is performed by the image processing unit 115-*a*. The defect region image 52-*a* obtained as a result of the image subtraction process is stored into the memory 114-*a*. Next, using the defect region 53-*a* obtained from the defect region image 52-*a*, the visual feature of the image of a region on the programmed-point inspection image 50-*a* corresponding to the defect region 53-*a* is calculated by the image processing unit 115-*a* to characterize the defect (S606-*a*). Subsequently, if there is a chip subjected to the next programmed-point inspection, the flow returns to S603-*a* (S607-*a*). If there remains no chip subjected to the next programmed-point inspection, the wafer is unloaded from the stage 116-*a* of the SEM device 10-*a* (S608-*a*). Note that Step S608-*a* may be skipped, and the subsequent processings may be performed while holding the wafer inside the device. Finally the feature value of the defect calculated at each programmed inspection point is output to the user terminal 118-*a*, and the flow is completed (S609-*a*). Here, as the method of outputting, for example, for each programmed inspection point within a chip or for each group of programmed inspection points having the same circuit pattern shape within a chip, a view called a wafer map may be shown, wherein a false color or the like is applied to the view of the wafer and chips shown in FIG. 19 in accordance with the feature value of the defect of a chip having been subjected to the programmed-point inspection and the result is displayed, or a histogram of feature values of the defects may be displayed. In the flow of FIG. 23, the images at a predetermined chip coordinate of different chips on the same wafer are assumed to be captured and inspected, however other than this, an image at a predetermined chip coordinate of a predetermined chip may be imaged and inspected across a plurality of wafers. In this case, for each programmed inspection point within a chip or for each group of programmed inspection points having the same circuit pattern shape within a chip, a transition diagram of the feature value of a defect of the same chip across a plurality of wafers may be shown, or a transition diagram of the feature value of a defect of a chip included in an arbitrary region of a wafer across a plurality of wafers may be shown, or the above-described wafer map across a plurality of wafers may be displayed at the same time. The display contents may be stored into the memory 114-*a* or the secondary storage unit 117-*a* so as to be able to be reproduced.

Figure 24:
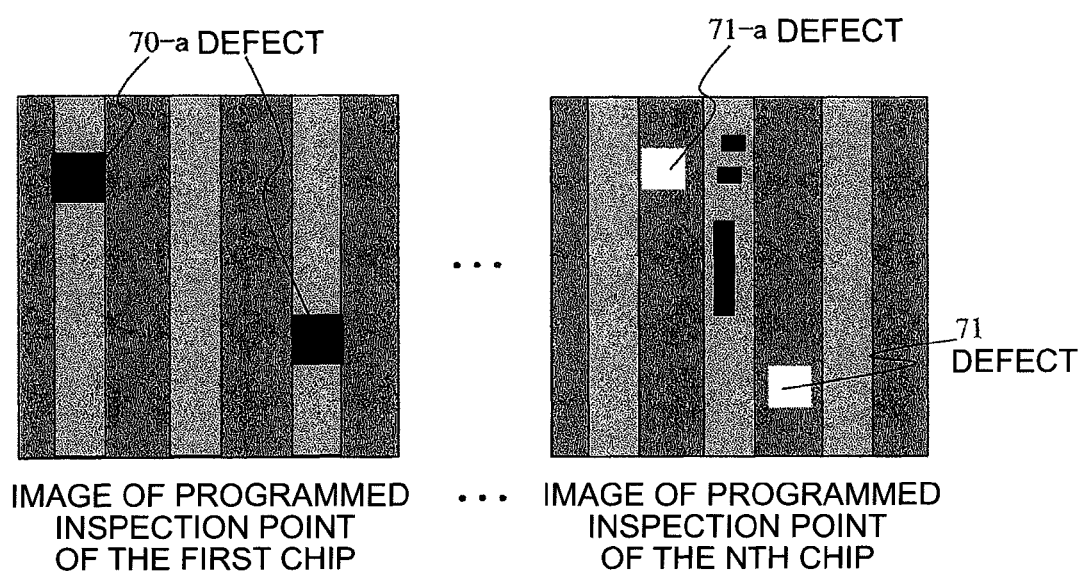
FIG. 24 is an example of the inspection image used to generate a golden pattern image.

Incidentally, when conditioning the process, for example, in an early phase of semiconductor development, a good chip without a defect may be difficult to be obtained. FIG. 24 is a view schematically showing the images captured at a programmed inspection point in N chips. This view shows that there is no good chip at any position, and defects are not uniquely generated, and depending on the location, the occurrence position of a defect or the appearance of a generated defect, such as a black defect 70-*a* and a white defect 71-*a*, differs. Because there is no good chip, with regard to one pattern a golden pattern image cannot be obtained from one place.

Figure 25:
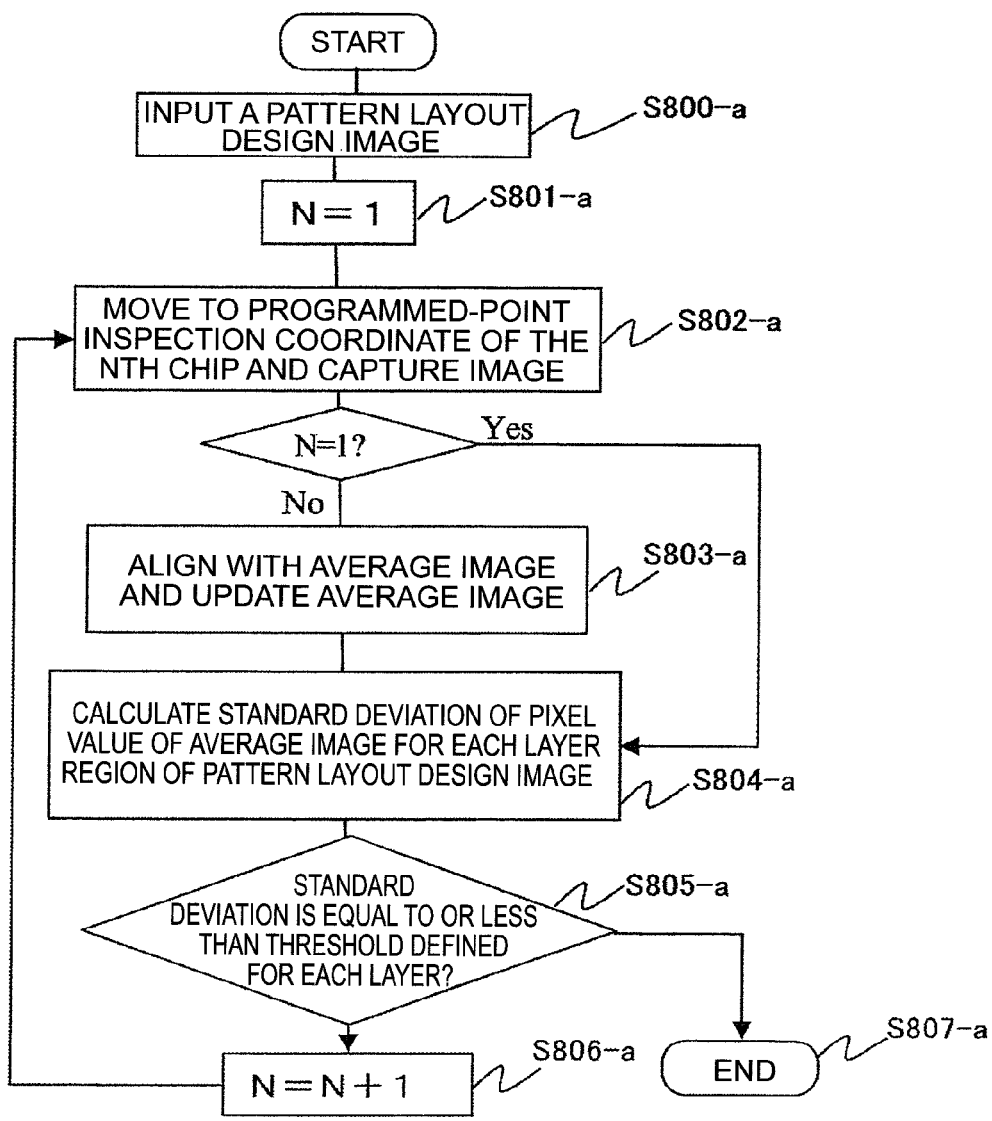
FIG. 25 is a flow diagram of generating a golden pattern image.
Figure 26:
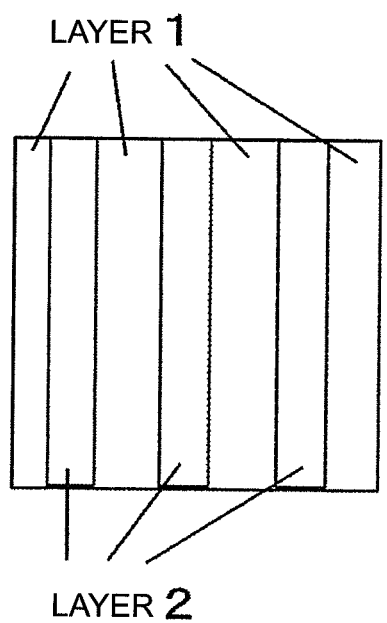
FIG. 26 is an example of a pattern layout design image.

When a golden pattern image cannot be obtained by one time of imaging, the golden pattern image is generated using the images captured at a plurality of locations. FIG. 25 shows a procedure of capturing images of one circuit pattern shape at a plurality of programmed inspection points and creating a golden pattern image. First, a pattern layout design image is input (S800-*a*). FIG. 26 shows a pattern layout design image corresponding to the inspection image shown in FIG. 24, as an example. The pattern layout design image is an image, with which the layers, such as wiring layers and underlayers, can be distinguished and a correspondence between an image coordinate on the pattern layout design image and the layers can be recognized. The pattern layout design image may be generated from the design data of a pattern layout design, or may be generated from a line drawing representing the pattern layout design that is manually input based on an inspection image, or one or more inspection images are added and binarized using an adequate threshold, and then a line drawing representing the pattern layout design may be generated by image processing, such as extracting the edge of a circuit pattern. The methods of inputting a line drawing representing the pattern layout design that is manually input based on an inspection image include a method, wherein an inspection image is displayed on a display of the computer terminal 118-*a* of FIG. 18, and the line drawing is created by indicating the edge position of a circuit pattern on the image with a pointer displayed on the screen. As to the indication with a pointer, not only a method for tracing the edge position of a circuit pattern with a pointer, but also an efficient method can be conceivable for indicating and inputting both end points on an image if the edge of a circuit pattern is a line.

Next, the positioning of the stage 116 of FIG. 18 is performed so that the programmed inspection point of the first chip (N=1) becomes the region to be imaged 109-*a* of FIG. 18 and an inspection image is captured (S801-*a*, S802-*a*). Here, in the case of the first chip, usually there is no average image, so the flow proceeds to Step S804-*a* to be described later. If there is an already-generated average image for the second and subsequent chips (N≥2), the average image is updated after performing the alignment with the inspection image (S803-*a*). Here, the average image refers to an image obtained by adding and averaging the pixel value for each pixel. Other than this, a method for calculating the medium value of the pixel value of the same each pixel of a plurality of captured images, a method for calculating the standard deviation of the pixel value of the same each pixel of a plurality of captured images and excluding exceptional values to calculate an average value, or the like may be used, as appropriate, to create the average image. Note that, when an average image available in a wafer having been through the same type of step or the same step is already generated, this average image may be used and the flow may proceed to Step S803-a from the first chip.

Subsequently, in Step S804-a, the standard deviation value (variation) of the pixel values of the average image is calculated for each region indicated in each layer shown in a pattern layout design image, and in Step S805-a, a threshold defined in a unit of each layer is compared with the calculated standard deviation value, and if the standard deviation value is within the threshold in all the layers, the flow is completed (S807-a) or otherwise, the image of the next chip is further captured and Step S802-a to Step S805-a are repeated.

Figure 27:
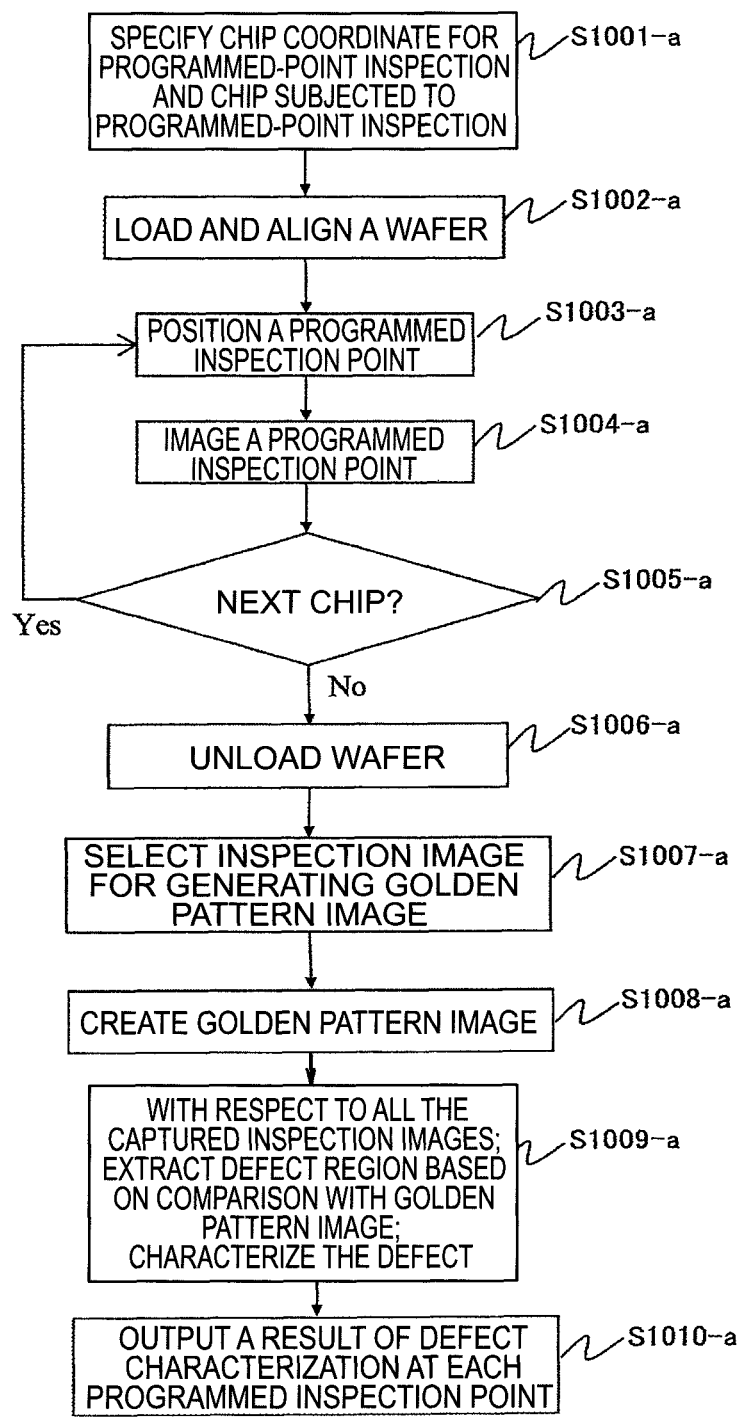
FIG. 27 is a second flow diagram of programmed-point inspection.

As stated above, FIG. 25 shows a flow of successively capturing inspection images for generating a golden pattern image, however after capturing all of or a plurality of inspection images first, the images for generating a golden pattern image may be selected. This procedure is described using FIG. 18 and FIG. 27. First, the chip coordinate at a programmed inspection point and the chip where programmed-point inspection is performed are specified (S1001-a). These are specified from the user terminal 118-a. Next, the wafer 108-a is loaded onto the stage 116-a of the SEM device body 10-a, and the wafer coordinate and the coordinate system of the stage 116-a are associated with each other using an alignment mark on the wafer (S1002-a). The sequence of Step 1000-a and Step 1001-a may be reversed. Hereinafter, S1003-a to S1005-a are repeated with respect to the chip specified in S1001-a.

First, the positioning of the stage 116-a is performed so that the programmed inspection point of the specified chip becomes the region to be imaged 109-a (S1003-a). Next, the programmed-point inspection image 50-a is imaged and stored into the memory 114-a (S1004-a). If there is still a chip subjected to the programmed-point inspection, the flow returns to S1003-a (S1005-a). If there remains no chip subjected to the next programmed-point inspection, the wafer is unloaded from the stage 116-a of the SEM device 10-a (S10068-a). Step S1006-a may be skipped, and the subsequent processings may be performed while holding the wafer inside the device.

Next, in Step S1007-a, one or a plurality of images for generating a golden pattern image are selected from a plurality of captured inspection images, and in Step S1008-a, a golden pattern image is generated and stored into the memory 114-a. Note that a method for selecting an inspection image and a method for generating a golden pattern image using a selected inspection image are described later using FIG. 28 and FIG. 29. After generating a golden pattern image, an image subtraction process of both images is performed by the image processing unit 115-a using all the inspection images stored in the memory 114-a and the golden pattern image stored in the memory 114-a. A defect region image obtained as a result of the image subtraction process is stored into the memory 114-a. Next, using a defect region obtained from the defect region image, the visual feature of the image of a region on the inspection image corresponding to the defect region is calculated by the image processing unit 115-a to characterize the defect (S1009-a). Finally the feature value of the defect calculated at each programmed inspection point is output to the user terminal 118-a, and the flow is completed (S1010-a). The method for outputting is as previously described.

Figure 28:
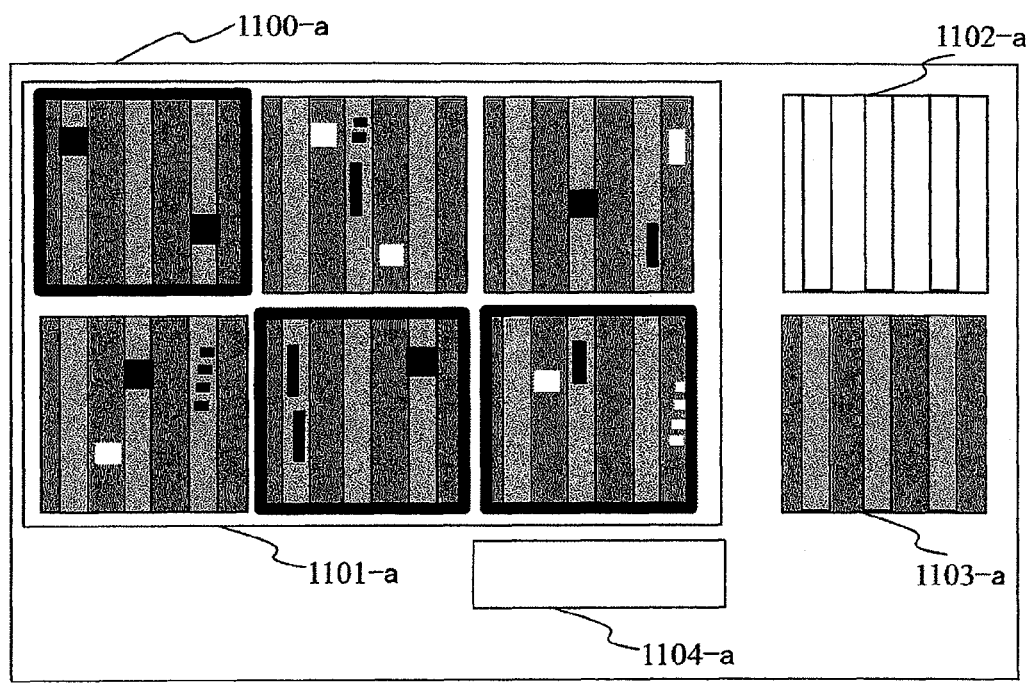
FIG. 28 is diagram of a first screen-configuration for generating a golden pattern image.

FIG. 28 is a view showing a first screen-configuration for selecting an image for generating a golden pattern image from the captured inspection images after capturing all the inspection images, wherein reference numeral 1100-a represents the screen. Reference numeral 1101-a represents a region where the captured inspection image is displayed. If all the captured inspection images cannot be displayed at once, only the inside of the region 1101-a is scrolled with a non-illustrated unit or the screen is made switchable, thereby making all the required inspection images accessible. Among a plurality of inspection images displayed inside the region 1101-a, an image surrounded by a thick line represents an inspection image, which is specified to be used in generating the average image, is indicated by clicking a selected image by an operator. A pattern layout design image 1102-a corresponding to an inspection image may be generated from the pattern layout design data, or may be manually input by an operator based on the inspection image, or may be generated by image processing based on the inspection image. The pattern layout design image 1102-a can be used to determine whether to process the inspection image in accordance with what kind of layer region, for the purpose of generating a golden pattern image. Reference numeral 1103-a represents an average image generated from one or more inspection images selected within the region 1101-a. Reference numeral 1104-a represents a numerical value display area, where the standard deviation of the average image of each layer and the threshold defined for each layer are displayed.

Figure 29:
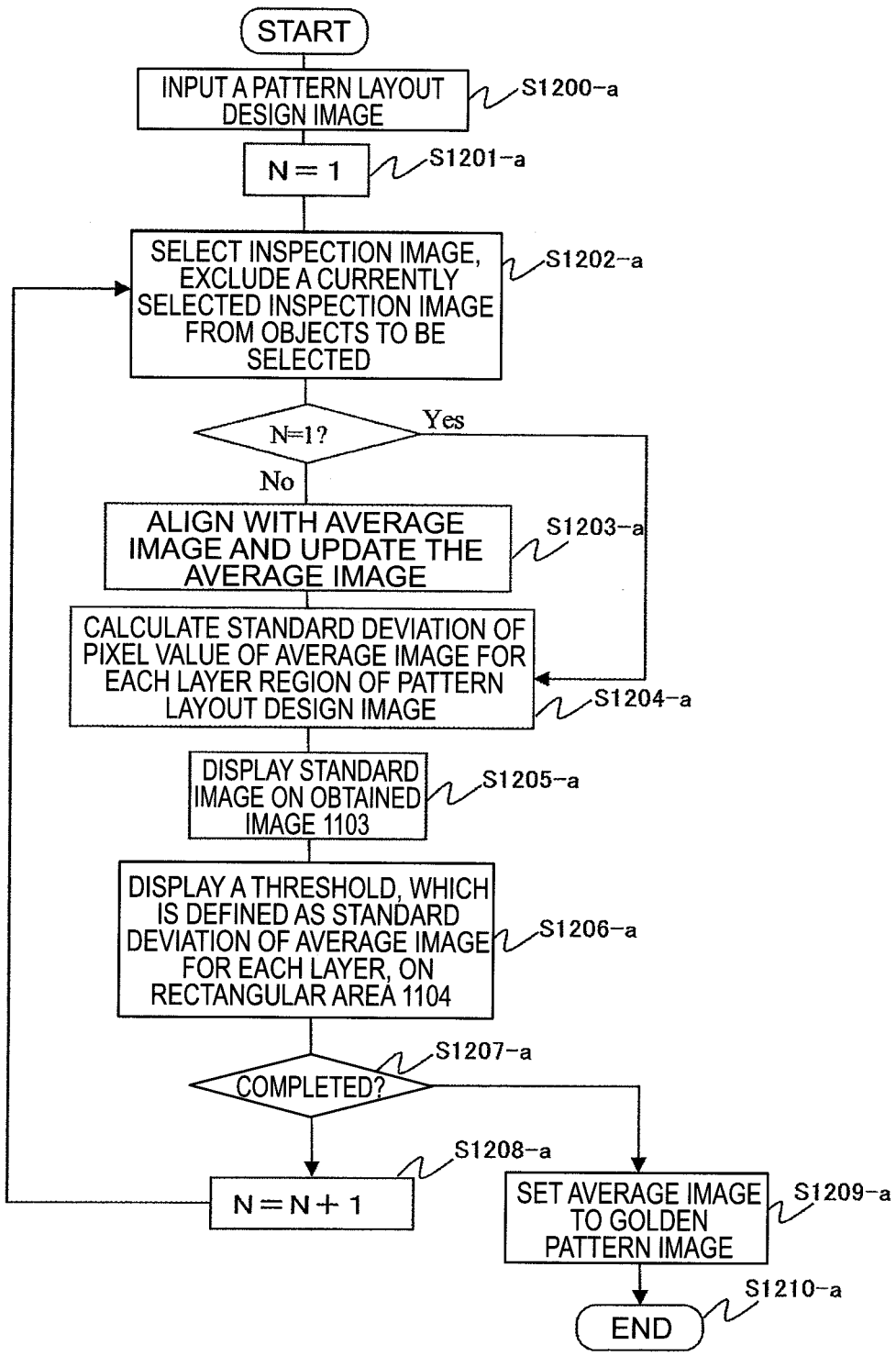
FIG. 29 is a flow diagram of generating a golden pattern image in the first screen-configuration.

A flow of generating a golden pattern image using the screen shown in FIG. 28 is shown in FIG. 29. First, a pattern layout design image is input (S1200-a), and an inspection image is selected among a plurality of inspection images stored in the memory 114-a (S1202-a). Subsequently, if there is an already-generated average image, the average image is updated after performing the alignment with the captured image (S1203-a). Note that, if there is no already-generated average image (N=1), the flow proceeds to Step S1204-a without through Step S1203-a. In Step S1204-a, the standard deviation value of a pixel value of an average image is calculated for each region shown by each layer shown in a pattern layout design image, and in Step S1205-a an average image is displayed on the average image 1103-a of FIG. 28, and the standard deviation of the average image of each layer and the threshold defined for each layer are displayed on the numerical value display area 1104-a of FIG. 28 (S1206-a). An operator, with reference to the average image displayed on the average image 1103-a and the standard deviation of the average image of each layer and the threshold defined for each layer displayed on the numerical value display area 1104-a, studies whether or not the generated average image is used as a golden pattern image and determines whether or not the process is completed (S1207-a). If a further inspection image is additionally selected, the flow returns to Step S1202-a, and Steps S1202-a to S1207-a are repeated. Note that, in Step S1202-a, upon selection of an inspection image, the inspection image being selected can be removed from the object to be inspected, so as to be able to select an optimum inspection image for generating an optimal golden pattern image. In Step S1207-a, if an average image or a relationship between the standard deviation of the average image of each layer and the threshold defined for each layer is determined to be appropriate by an operator, the flow proceeds to Step S1209-a, where the generated average image is set to a golden pattern image, and the process is completed (S1210-a). Next, an example of a second screen-configuration for selecting an image for generating a golden pattern image from captured inspection images after capturing all the inspection images is described using FIG. 30. A region 1301-*a* displayed on a screen 1300-*a* is the region for displaying captured inspection images. If all the captured inspection images cannot be displayed at once, only the inside of the region 1301-*a* is, for example, scrolled with a non-illustrated unit, thereby making all the inspection images accessible. Among the inspection images displayed inside the region 1301-*a*, images surrounded by a thick line is an inspection image, which is specified to be used for generation of an average image, and is indicated by clicking a selected image by an operator. Reference numeral 1303-*a* represents a pattern layout design image corresponding to an inspection image, and may be generated from pattern layout design data, or may be manually input by an operator based on the inspection image, or may be generated by image processing based on the inspection image. The pattern layout design image 1303-*a* can be used to determine whether to process the inspection image in accordance with what kind of layer region, for the purpose of generating an average image. Reference numeral 1304-*a* represents an average image that is generated from one or more inspection images selected among a plurality of inspection images within the region 1301-*a*. Reference numeral 1302-*a* represents a region for displaying an image indicative of a result obtained by extracting a defect region using the inspection image and the average image displayed in the region 1301-*a*. The images displayed at the same position in the region 1301-*a* and in the region 1302-*a* correspond to each other. The information described in Step S609-*a* in FIG. 23 is output to a wafer map 1305-*a*. Reference numeral 1306-*a* represents a numerical value display area, where the standard deviation of the average image of each layer and the threshold defined for each layer are displayed.

Figure 30:
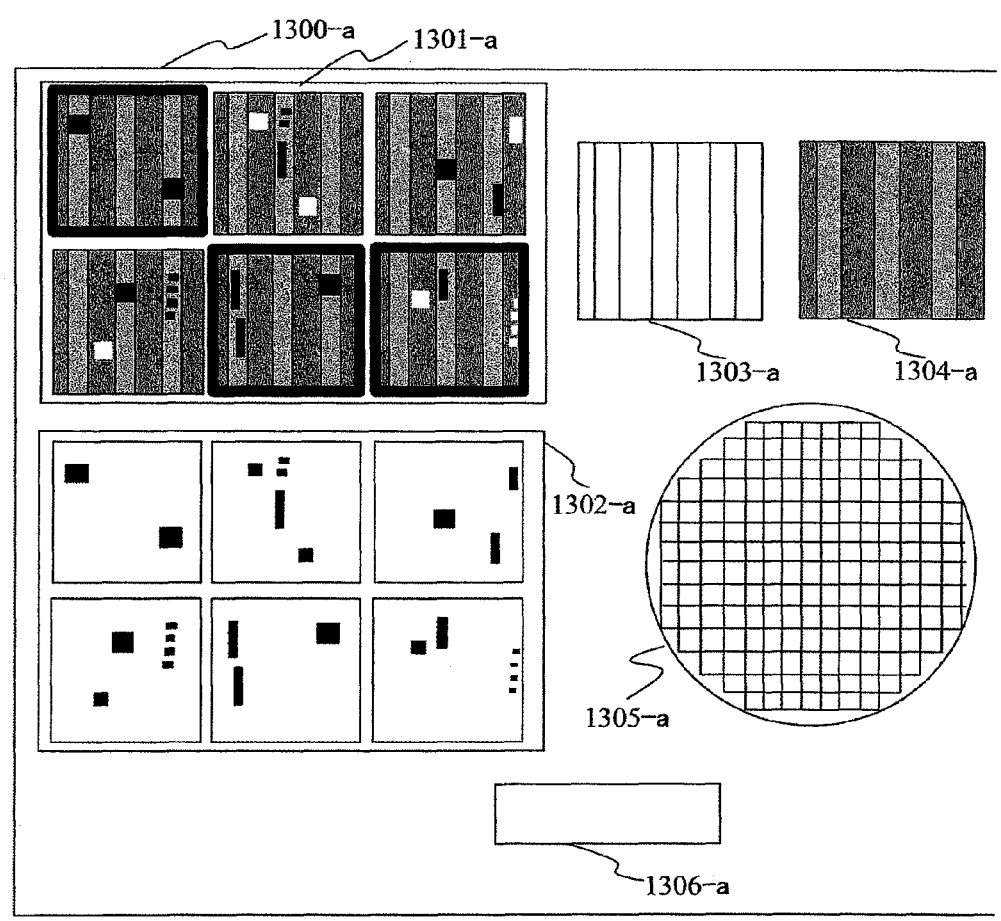
FIG. 30 is a diagram of a second screen-configuration for generating a golden pattern image.
Figure 31:
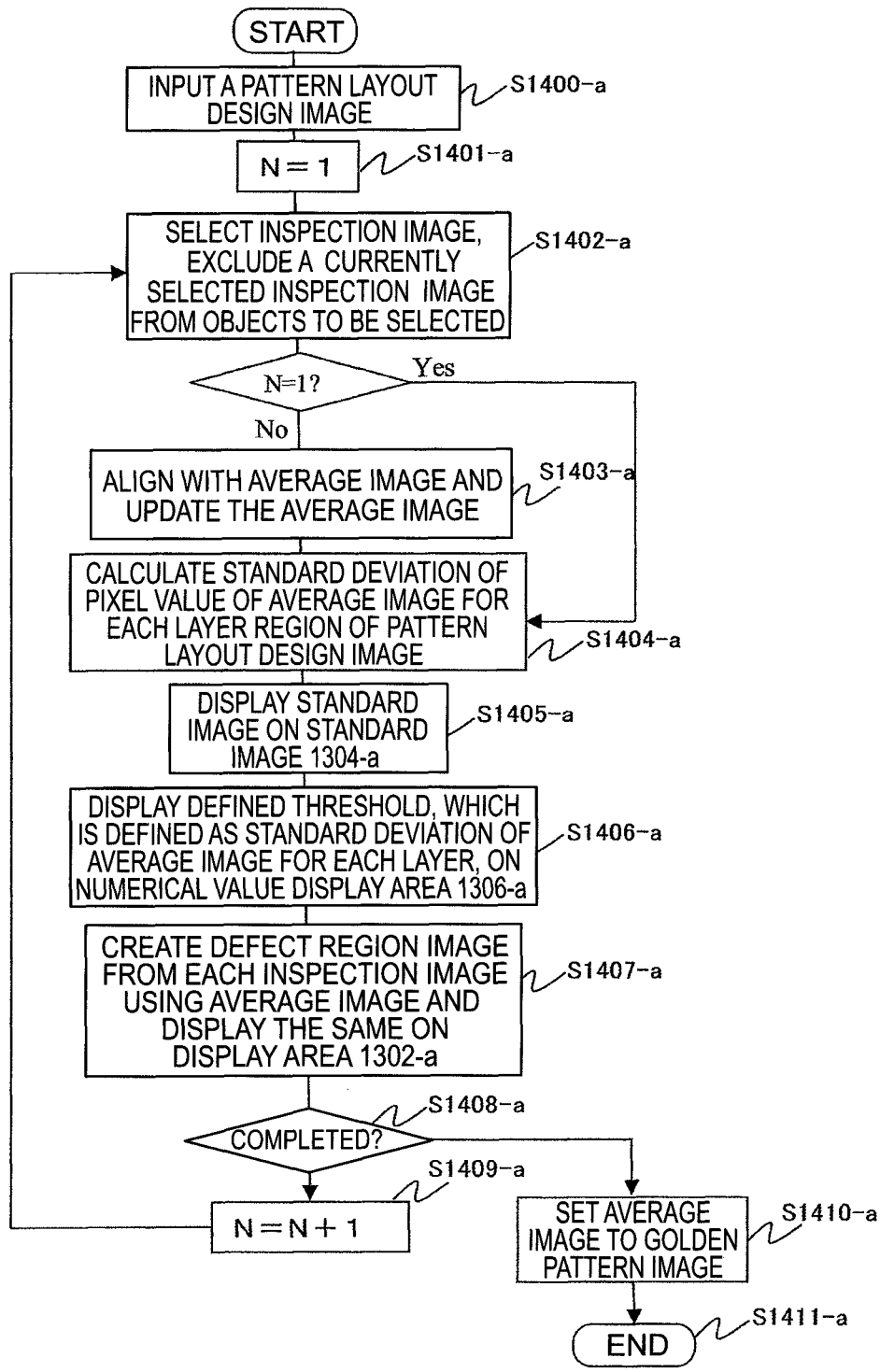
FIG. 31 is a flow diagram of generating a golden pattern image in the second screen-configuration.

A flow of generating a golden pattern image using the screen shown in FIG. 30 is shown in FIG. 31. First, a pattern layout design image is input (S1400-*a*), and an inspection image is selected (S1402-*a*). Subsequently, if there is an already-generated average image, the average image is updated after performing the alignment with the captured image (S1403-*a*). Note that, if there is no already-generated average image (N=1), the flow proceeds to Step S1404-*a* without through Step S1403-*a*. In Step S1404-*a*, the standard deviation value of a pixel value of an average image is calculated for each region shown by each layer shown in a pattern layout design image, and in Step S1405-*a* the average image is displayed on the average image 1103-*a* of FIG. 28, and the standard deviation of the average image of each layer and the threshold defined for each layer are displayed on the numerical value display area 1306-*a* of FIG. 30 (S1406-*a*). Furthermore, using the average image, a defect region image is generated from each inspection image and displayed on the region 1302-*a* (S1407-*a*). An operator, with reference to the average image displayed on the average image 1304-*a*, or a relationship between the standard deviation of the average image of each layer and the threshold defined for each layer displayed on the numerical value display area 1306-*a*, or a defect region image displayed on the region 1302-*a*, determines whether or not the generated average image is used as a golden pattern image, (S1408-*a*), and if a further inspection image is additionally selected, the flow returns to Step S1402-*a*, and Steps S1402-*a* to S1408-*a* are repeated. In Step S1402-*a*, upon selection of an inspection image, the inspection image being selected can be removed from the object to be inspected, so as to be able to select an optimum inspection image for generating an optimal golden pattern image. In Step S1408-*a*, if the average image, or the relationship between the standard deviation of the average image of each layer and the threshold defined for each layer, or the defect region image is determined to be appropriate by an operator, the flow proceeds to Step S1410-*a*, and the generated average image is used as the golden pattern image, and the process is completed (S1411-*a*). According to the method for generating a golden pattern image using the screen configuration shown in FIG. 30, the defect region image based on the generated golden pattern image can be successively confirmed, and therefore the process can proceed more intuitively by comparing a defect within an inspection image with a defect region image. Furthermore, because the wafer map is not unable to be created unless a golden pattern image is determined and the wafer map will also be successively updated, the overview of the occurrence of a defect can be instantaneously recognized.

Finally, the threshold shown in S805 of FIG. 25-*a* is described. For the threshold, a certain value may be set in advance for each layer, or a method for automatically determining the threshold from a captured image may be used. An example of the method for automatically determining the threshold from a captured image is described below. First, a grid for subdividing an image is set. The grid is not uniformly applied to an image but is set for each layer. Moreover, the dimensions of a grid are adjusted so as not produce a grid that spans layers. Here, assuming that there are M already-captured inspection images and also assuming that there are M grids belonging to one certain layer, one certain layer will be focused and described below. For each of N inspection images of M grids, the standard deviation value of the pixel value inside a grid is calculated. Thus, N×M standard deviation values are obtained. Here, a maximum value A (%) conceivable as the percentage, which a normal portion occupies relative to the area of a layer of interest, is permitted to be input and set from the computer terminal 118-*a* of FIG. 18, and the obtained N×M standard deviation values are sorted in an ascending order, and the ((N×M)×A/100)th (here, the decimal numbers are truncated) standard deviation value from the beginning is set to the threshold in the corresponding layer. Thus, a threshold TH with respect to the standard deviation value for determining as a golden pattern image can be obtained. According to this method, the average image of each grid may be generated by selecting a grid image, whose standard deviation value is equal to or less than the TH, from N grid images in each grid.

According to the methods described above, even in a state where a good chip cannot be obtained in an early phase of semiconductor development, a golden pattern image for performing a comparison check can be generated. Thus, the occurrence of a defect can be grasped by implementing a highly sensitive comparison check, and the process conditioning can be speeded up.

REFERENCE SIGNS LIST

100 . . . electron beam microscope, 101 . . . enclosure, 102 . . . table, 103 . . . semiconductor wafer, 104 . . . electron-gun, 105 . . . electron beam, 106 . . . deflector, 107 . . . electron lens, 110 . . . A/D converter, 111 . . . processing unit, 112 . . . user interface unit, 113 . . . storage unit, 114 . . . general control unit, 1121 . . . GUI screen, 1701 . . . electron-gun, 1302 . . . electron beam, 1303 . . . deflector, 1304 . . . objective lens, 1305 . . . semiconductor wafer, 1306 . . . stage, 1308 . . . detector, 1309 . . . A/D converter, 1310 . . . image processing circuit, 1311 . . . detection condition control unit, 1312 . . . image processing control unit, 1313 . . . general control unit, 1314 . . . data storage unit, 1315 . . . user interface unit, 10-*a* . . . SEM device body, 100-*a* . . . electron beam, 101-*a* . . . electron-gun, 102-*a* . . . electron lens, 103-*a* electron lens, 104-*a* . . . electron beam axis aligner, 105-*a* . . . deflector, 106-*a* . . . deflector, 107-*a* . . . objective lens, 108-*a* . . . wafer, 109-*a* . . . region to be imaged, 110-*a* . . . reflective plate, 110'-*a* . . . primary electron beam through-hole, 111-*a* . . . electronic detector, 112-*a* . . . A/D converter, 113-*a* . . . adder circuit, 114-*a* . . . memory, 115-*a* . . . image processing unit, 116-*a* . . . XY stage, 117-*a* . . . secondary storage unit, 118-*a* . . . computer terminal, 119-*a* . . . general control system, 120-*a* . . . current-amount control unit, 121-*a* . . . deflection control unit, 122-*a* . . . electron lens control unit, 123-*a* . . . stage control unit, 124-*a* . . . sequence control unit, 125-*a* . . . data conversion unit, 126-*a* . . . data input unit, 127-*a* . . . image signal processing system, 30-*a* . . . chip, 31-*a* . . . inspection point, 50-*a* . . . programmed point inspection image, 51-*a* . . . golden pattern image, 52-*a* . . . defect region image, 53-*a* . . . defect region, 1100-*a* . . . screen, 1101-*a* . . . inspection image display area, 1102-*a* . . . pattern layout design image, 1103-*a* . . . average image, 1104-*a* . . . numerical value display area, 1300-*a* . . . screen, 1301-*a* . . . inspection image display area, 1302-*a* . . . defect region image display area, 1303-*a* . . . pattern layout design image, 1304-*a* . . . average image, 1305-*a* . . . wafer map, 1306-*a* . . . numerical value display area

The invention claimed is:

1. A defect check device using a SEM, comprising:
   a scanning electron microscope unit with a table that mounts a sample thereon and is movable within a plane, the sample having a plurality of dies formed therein, the dies each having a pattern of a same shape;
   a storage unit configured to store a SEM image of the sample that is obtained by imaging the sample mounted on the table by means of the scanning electron microscope unit;
   an image processing unit configured to process the SEM image of the sample stored in the storage unit and detect a defect on the sample;
   a user interface unit configured to input a condition for the image processing unit to process the SEM image of the sample, and output a result of the processing; and
   a control unit configured to control the scanning electron microscope unit, the storage unit, the image processing unit, and the user interface unit, wherein
   the control unit controls the scanning electron microscope unit to sequentially image a predetermined region of each of a plurality of dies formed on the sample and sequentially obtain the SEM image of the predetermined region of each of the plurality of dies, and store the sequentially obtained SEM images of the predetermined region into the storage unit, and wherein
   the image processing unit creates reference images using an averaging process on the sequentially obtained SEM images of the predetermined region stored in the storage unit, and compares one of the created reference images with the sequentially obtained SEM images of the predetermined region stored in the storage unit to extract a defect, and classifies the extracted defect;
   wherein said reference images comprise at least an average image for a center portion of the plurality of dies and an average image for a peripheral portion of the plurality of dies.

2. The defect check device using a SEM according to claim 1, wherein the acquisition of the SEM image by imaging the sample by means of the scanning electron microscope unit and the detection of a defect on the sample by processing the SEM image of the sample stored in the storage unit by means of the image processing unit are asynchronously performed.

3. The defect check device using a SEM according to claim 1 or 2, wherein the image processing unit creates reference images using a SEM image selected among a plurality of SEM images of a predetermined region stored in the storage unit.

4. The defect check device using a SEM according to claim 3, wherein the image processing unit sets a specific one of visual feature quantities of a plurality of SEM images of a predetermined region stored in the storage unit to an index value, selects an image whose index value is within a predetermined range and creates the reference images.

5. The defect check device using a SEM according to claim 4, wherein the predetermined range of the index value is set on the user interface unit.

* * * * *